(12) United States Patent
Bowers et al.

(10) Patent No.: US 12,464,669 B2
(45) Date of Patent: Nov. 4, 2025

(54) ELECTRONIC DEVICES AND METHODS OF MANUFACTURING ELECTRONIC DEVICES

(71) Applicant: Amkor Technology Singapore Holding Pte. Ltd., Singapore (SG)

(72) Inventors: Shaun Bowers, Gilbert, AZ (US); Pedro Joel Rivera-Marty, Chandler, AZ (US); Yoshio Matsuda, Hyogo (JP); Koichi Minami, Fukui (JP)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 140 days.

(21) Appl. No.: 18/204,871

(22) Filed: Jun. 1, 2023

(65) Prior Publication Data
US 2024/0292547 A1    Aug. 29, 2024

Related U.S. Application Data

(60) Provisional application No. 63/448,241, filed on Feb. 24, 2023.

(51) Int. Cl.
*H05K 5/10*    (2025.01)
*H05K 3/28*    (2006.01)
(Continued)

(52) U.S. Cl.
CPC .............. *H05K 5/10* (2025.01); *H05K 3/284* (2013.01); *H05K 3/3421* (2013.01); *H05K 3/4038* (2013.01)

(58) Field of Classification Search
CPC ........ H05K 5/10; H05K 3/284; H05K 3/3421; H05K 3/4038
(Continued)

(56) References Cited

U.S. PATENT DOCUMENTS 5,977,630 A    11/1999  Woodworth et al.
6,396,127 B1 *  5/2002  Munoz ................ H01L 23/4952
                                                       257/691
(Continued)

FOREIGN PATENT DOCUMENTS

JP    2005159238 A    6/2005
JP    4439143 B2      3/2010
(Continued)

OTHER PUBLICATIONS

HU3PAK Package Mounting and Thermal Behavior, ST Life Augmented, 2021, pp. 1-27, STMicroelectronics, NV, USA.

*Primary Examiner* — Binh B Tran
(74) *Attorney, Agent, or Firm* — Spectrum IP Law Group LLC

(57) ABSTRACT

In one example, an electronic device comprises a substrate structure, comprising a base comprising a top side and a bottom side, a first lead, and a flag comprising a top side, a bottom side, and a flag lead. The electronic device also comprises an electronic component comprising a top side and a bottom side, a first electrode at the bottom side of the electronic component, and second electrode at the top side of the electronic component, an encapsulant contacting a lateral side of the electronic component and a lateral side of the base, and a first interconnect in the encapsulant, coupled between the first electrode and the first lead. The second electrode is coupled with the flag lead via the base. Other examples and related methods are also disclosed herein.

20 Claims, 22 Drawing Sheets

(51) Int. Cl.
*H05K 3/34* (2006.01)
*H05K 3/40* (2006.01)

(58) Field of Classification Search
USPC .................................................... 361/679.01
See application file for complete search history.

(56) References Cited

U.S. PATENT DOCUMENTS

| | | | |
|---|---|---|---|
| 6,624,522 | B2 | 9/2003 | Standing et al. |
| 6,677,669 | B2 | 1/2004 | Standing |
| 7,034,385 | B2 * | 4/2006 | Ambrus ............. H01L 23/3107 |
| | | | 257/107 |
| 7,235,877 | B2 | 6/2007 | Pavier |
| 7,250,672 | B2 | 7/2007 | Pavier et al. |
| 7,375,424 | B2 | 5/2008 | Connah |
| 7,476,964 | B2 | 1/2009 | Standing |
| 8,222,718 | B2 | 7/2012 | Jereza et al. |
| 10,658,276 | B2 | 5/2020 | Chi et al. |
| 2004/0150082 | A1 | 8/2004 | Kajiwara et al. |
| 2005/0218498 | A1 | 10/2005 | Hata et al. |
| 2006/0274512 | A1 | 12/2006 | Brandenburg et al. |
| 2007/0114352 | A1 | 5/2007 | Cruz et al. |
| 2008/0122063 | A1 | 5/2008 | Akiba |
| 2008/0157433 | A1 | 7/2008 | Heng et al. |
| 2009/0002963 | A1 | 1/2009 | Cooney et al. |
| 2009/0283919 | A1 | 11/2009 | Tsui et al. |
| 2010/0155913 | A1 | 6/2010 | Madrid |
| 2010/0321894 | A1 | 12/2010 | Wang et al. |
| 2011/0309487 | A1 | 12/2011 | Satou et al. |
| 2012/0329214 | A1 | 12/2012 | Jereza et al. |
| 2015/0091146 | A1 | 4/2015 | Oh et al. |
| 2015/0102475 | A1 | 4/2015 | Lee et al. |
| 2015/0155228 | A1 | 6/2015 | Ikeda et al. |
| 2016/0002445 | A1 | 1/2016 | Mochizuki et al. |

FOREIGN PATENT DOCUMENTS

| | | |
|---|---|---|
| JP | 2011054889 A | 3/2011 |
| JP | 5308979 B2 | 10/2013 |
| JP | 5619128 B2 | 11/2014 |

* cited by examiner

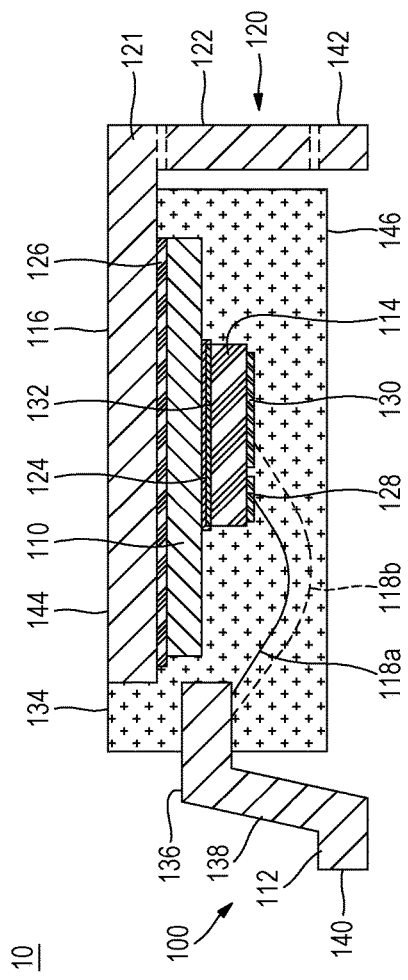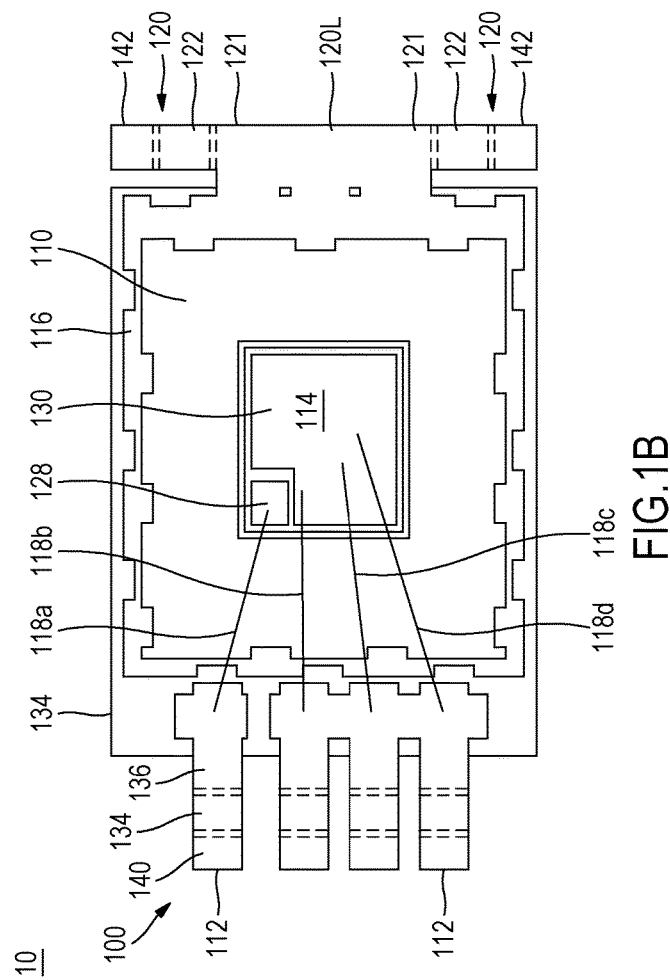

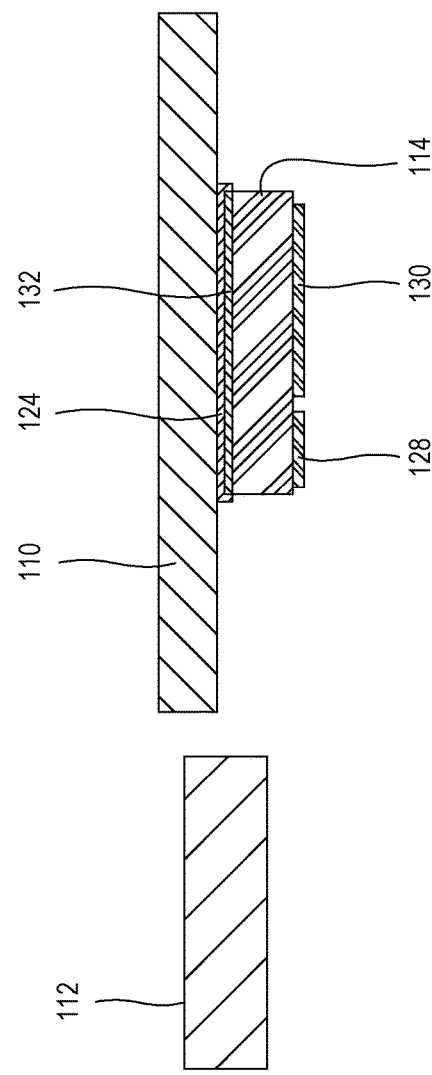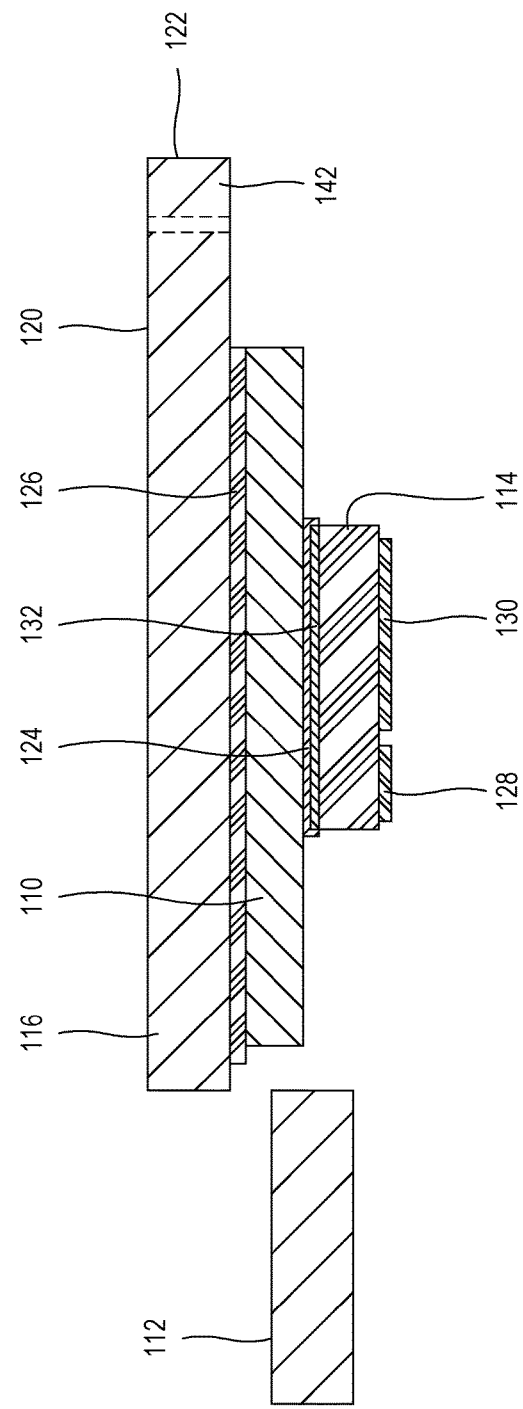

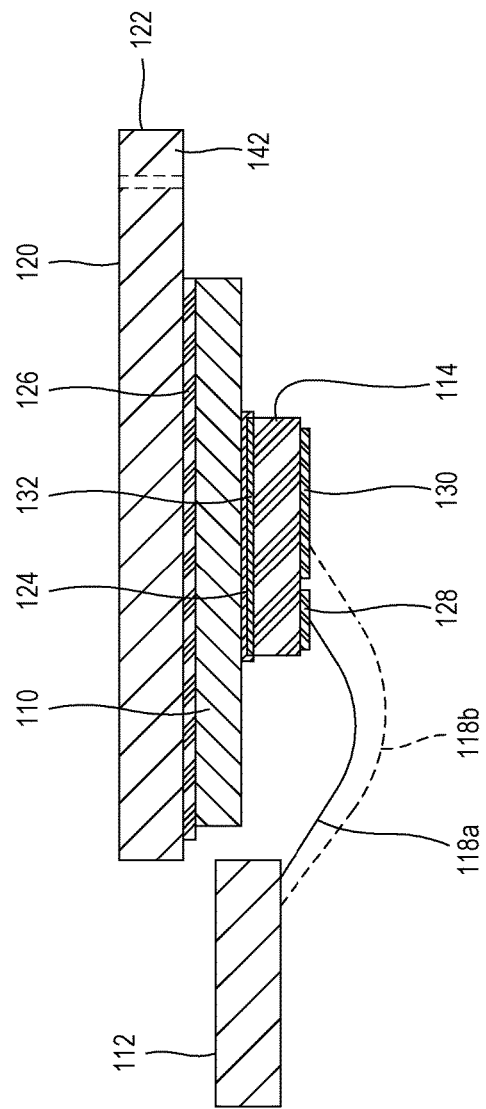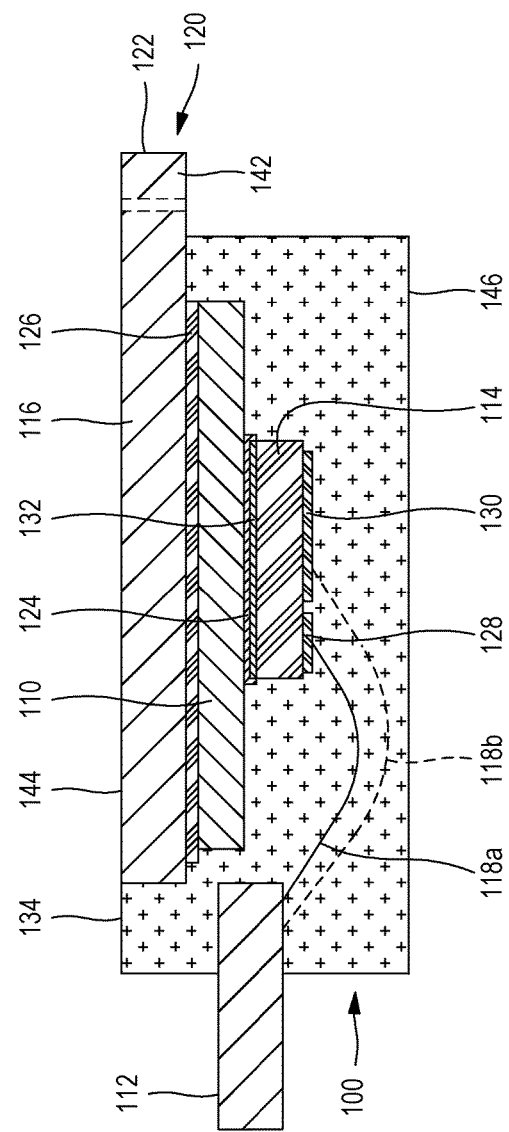

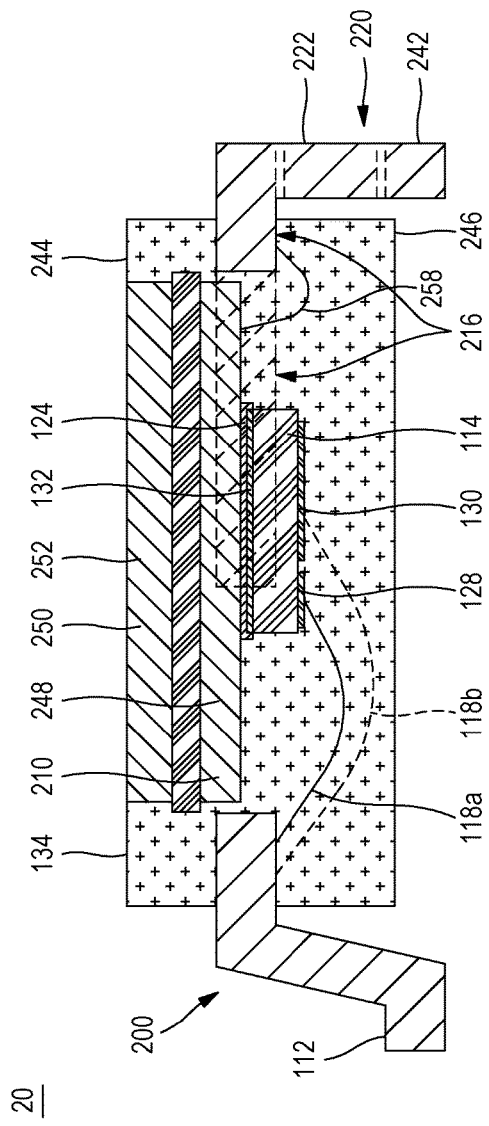
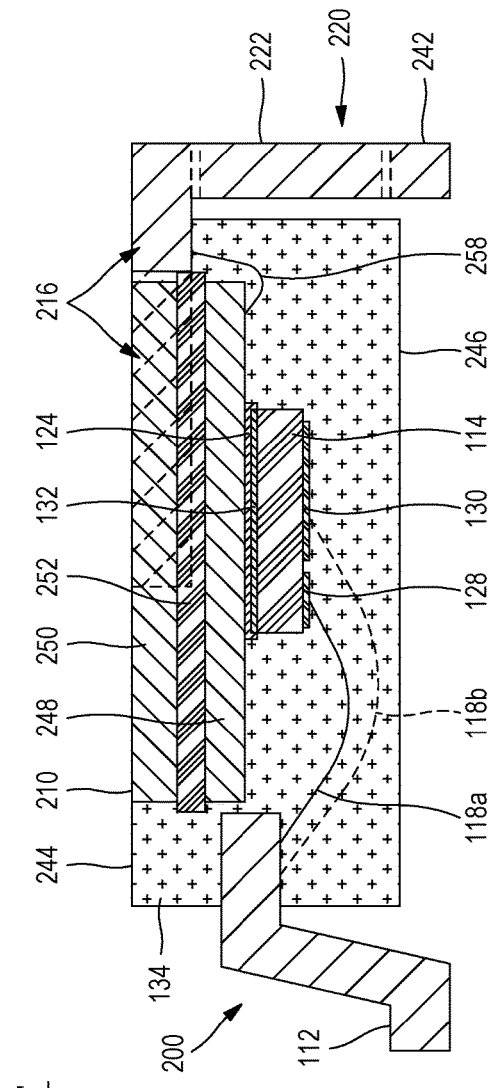
FIG.3A
FIG.3B

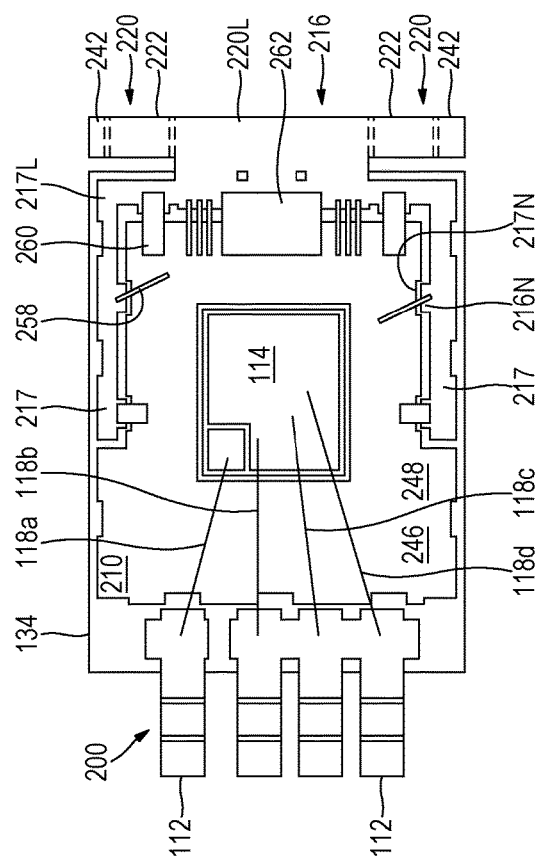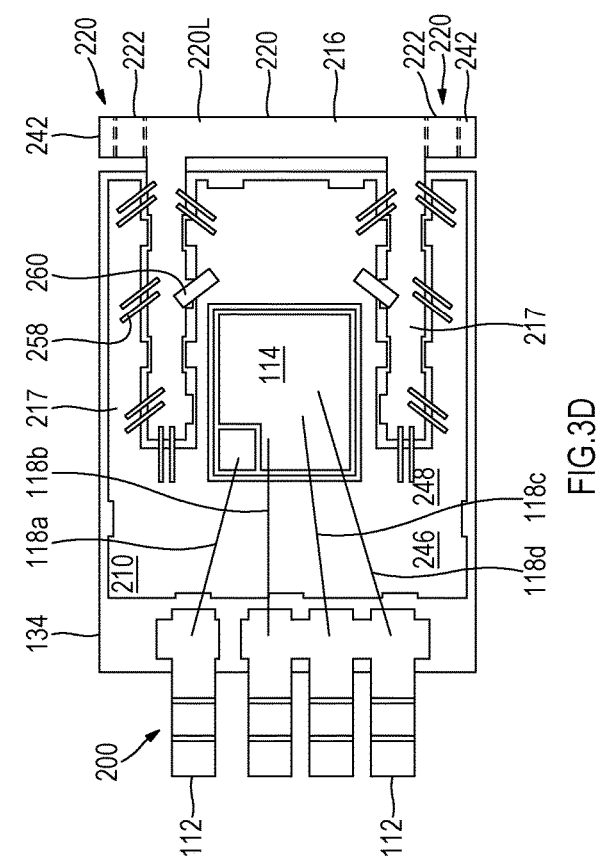

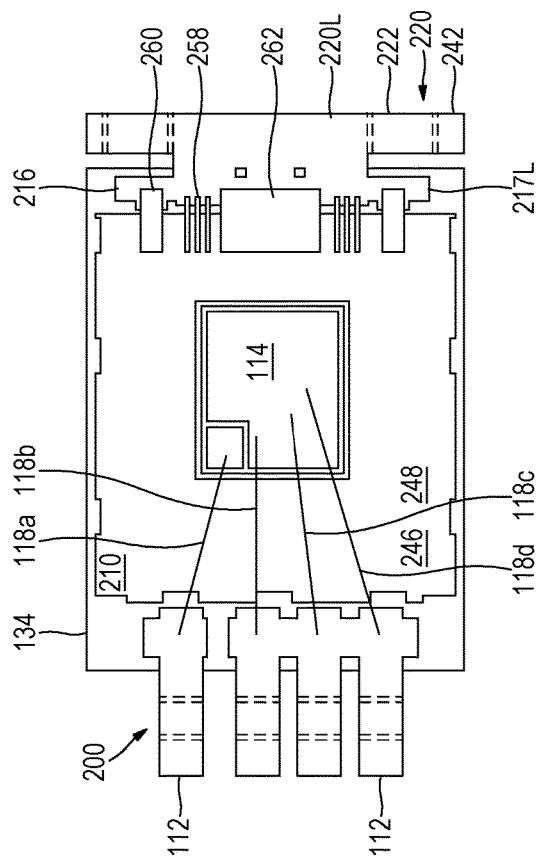
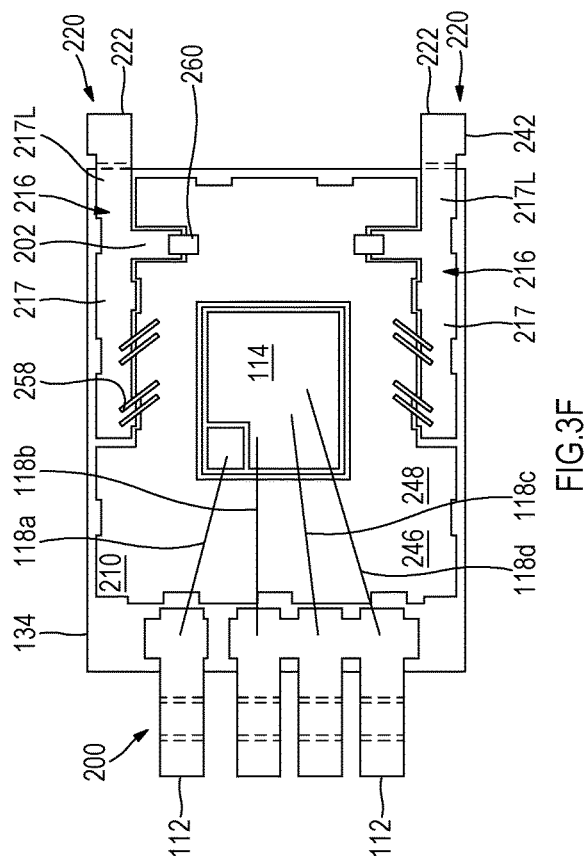

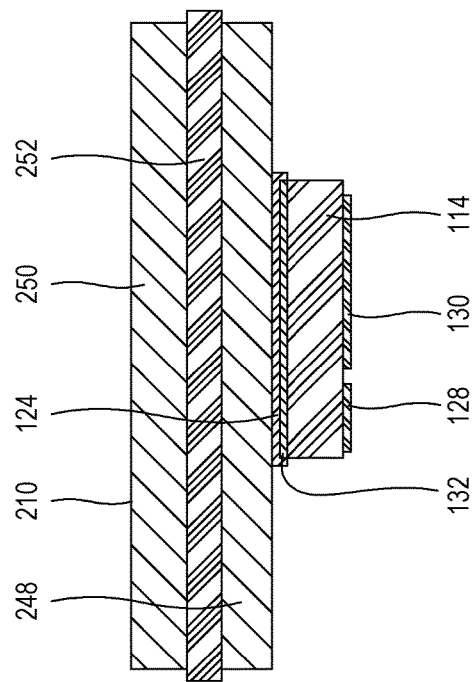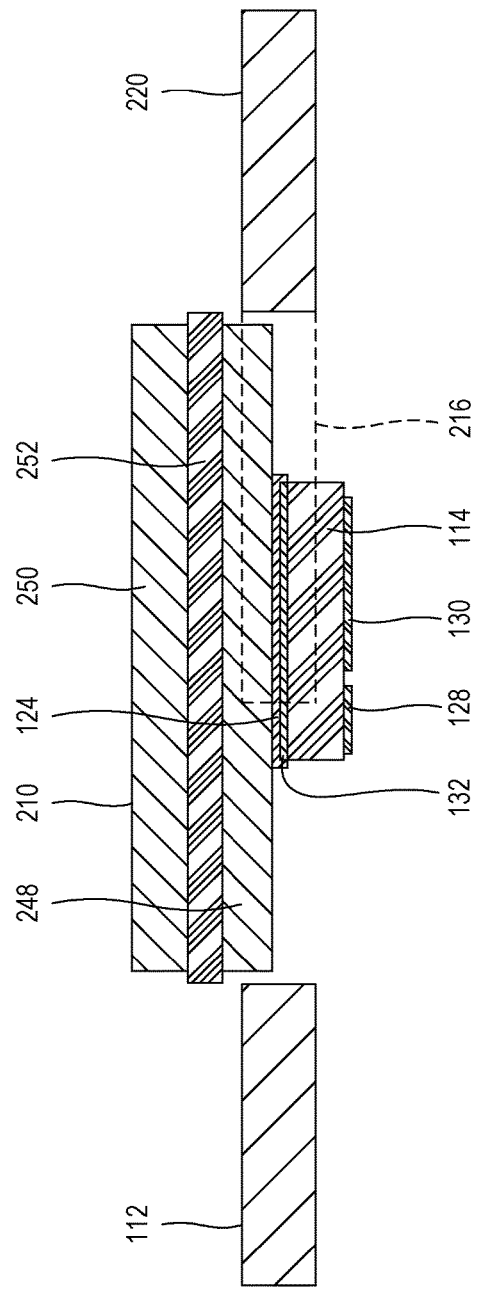
FIG.4A
FIG.4B

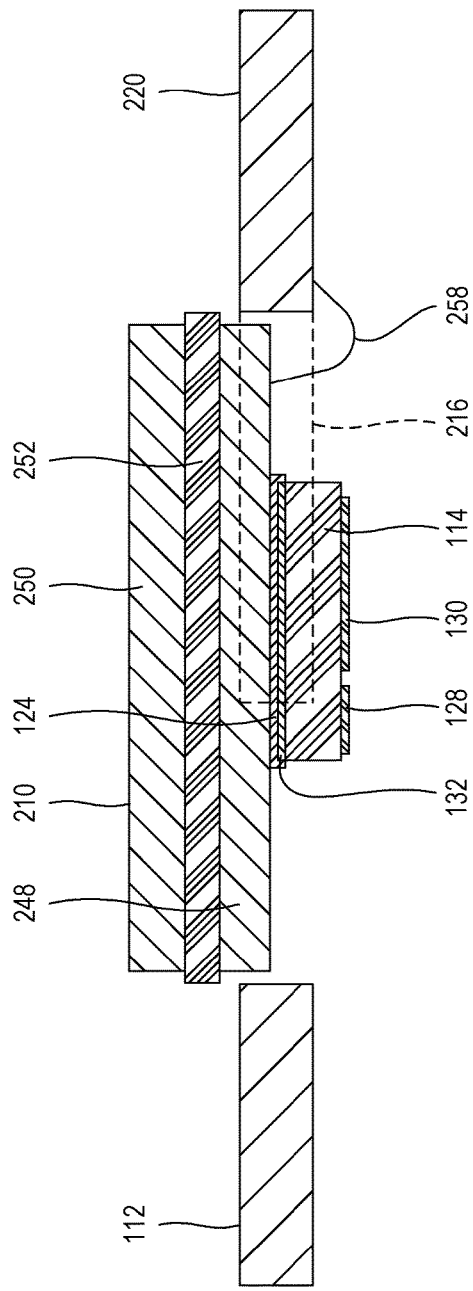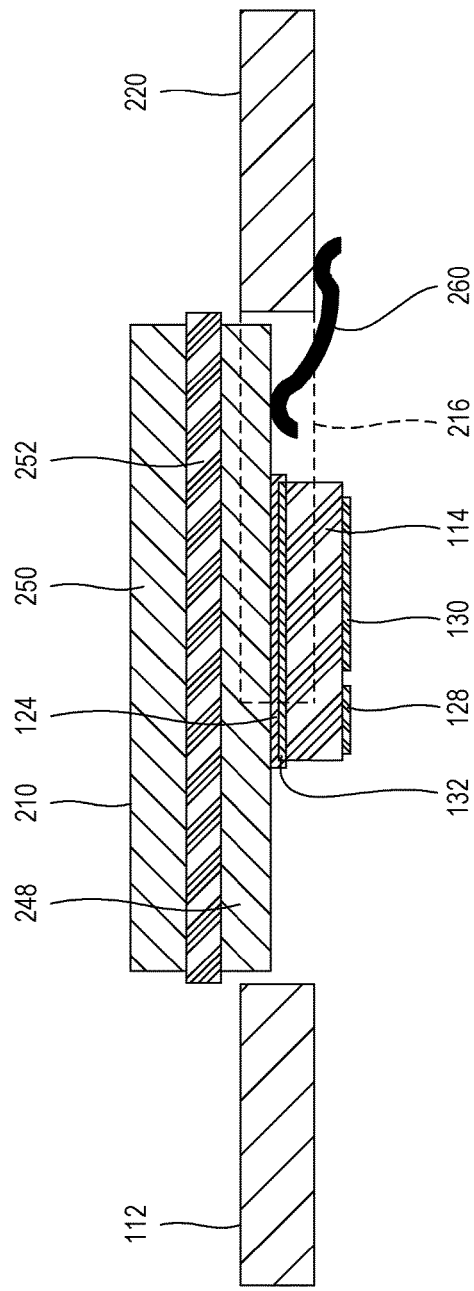

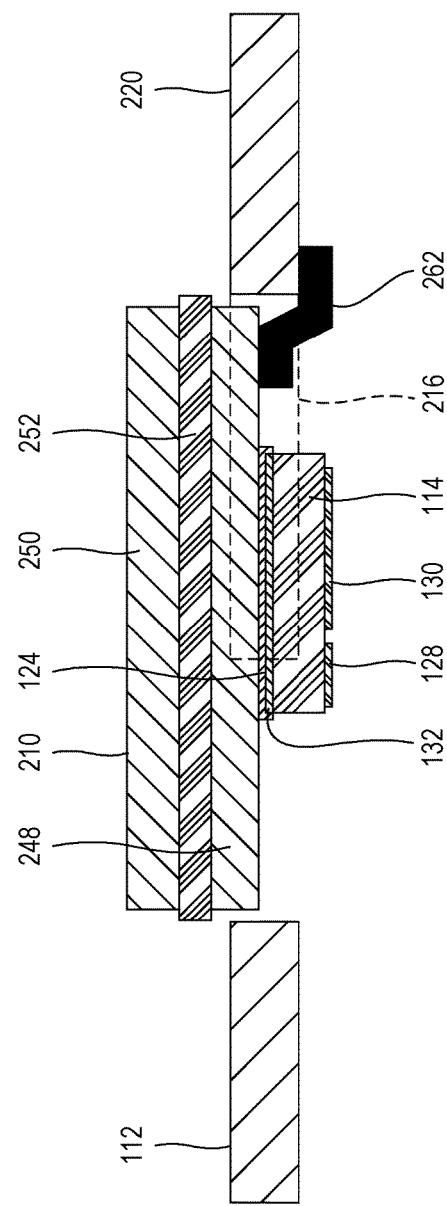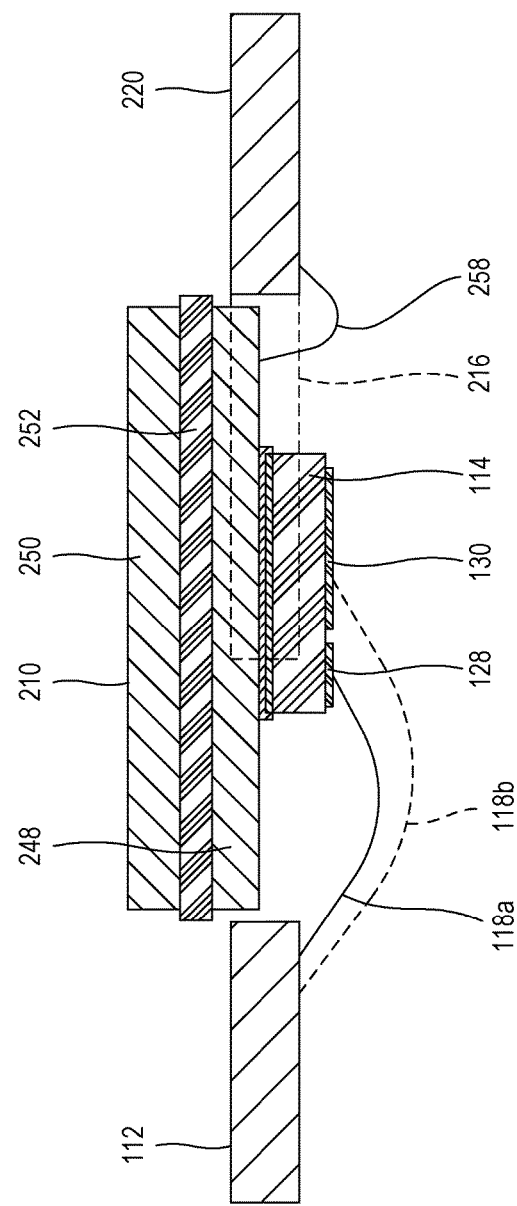

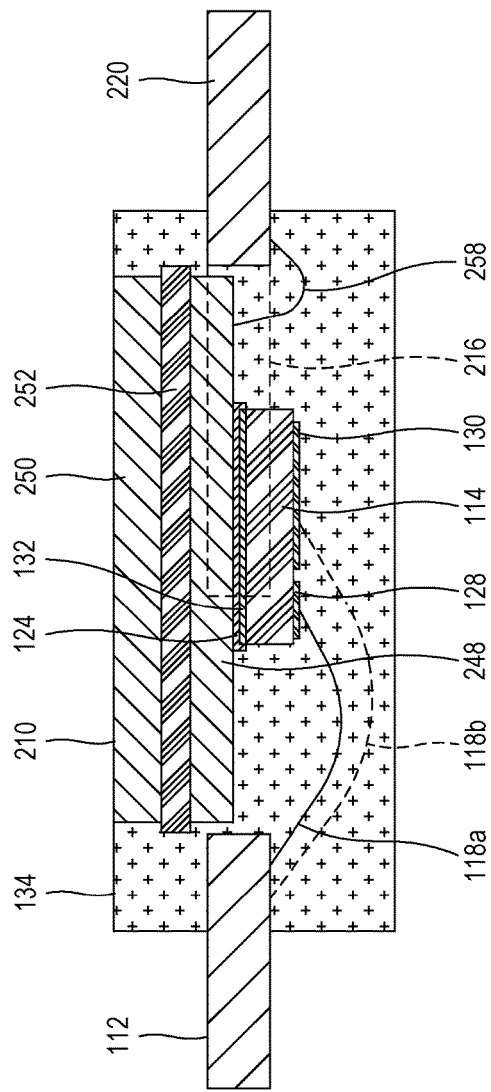
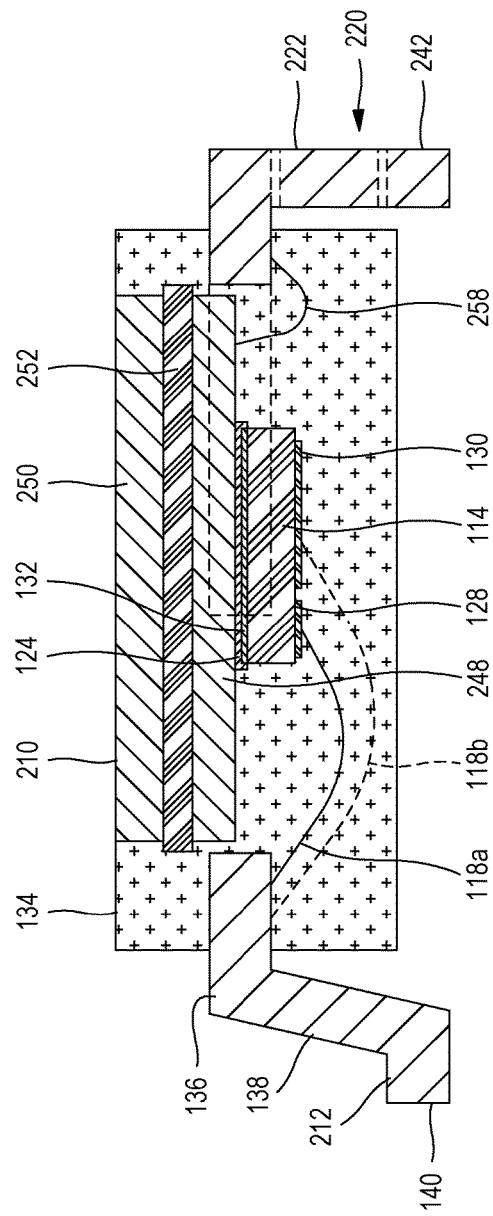
FIG.4G
FIG.4H

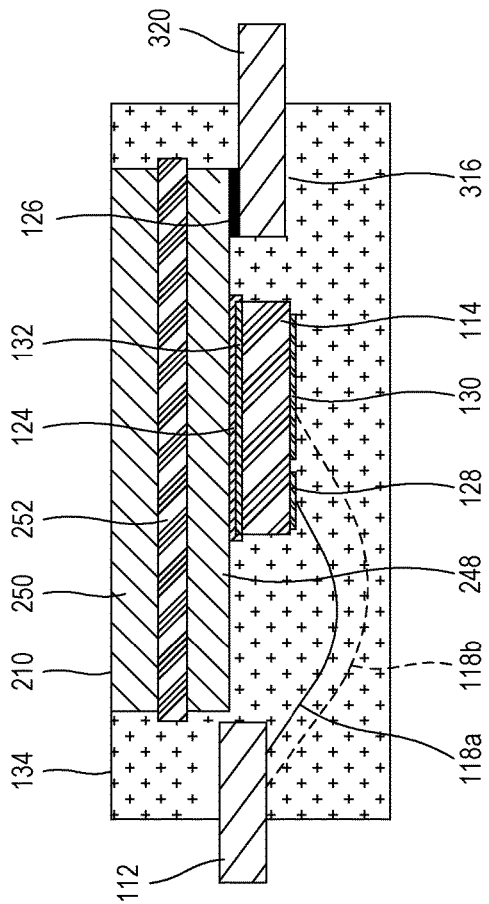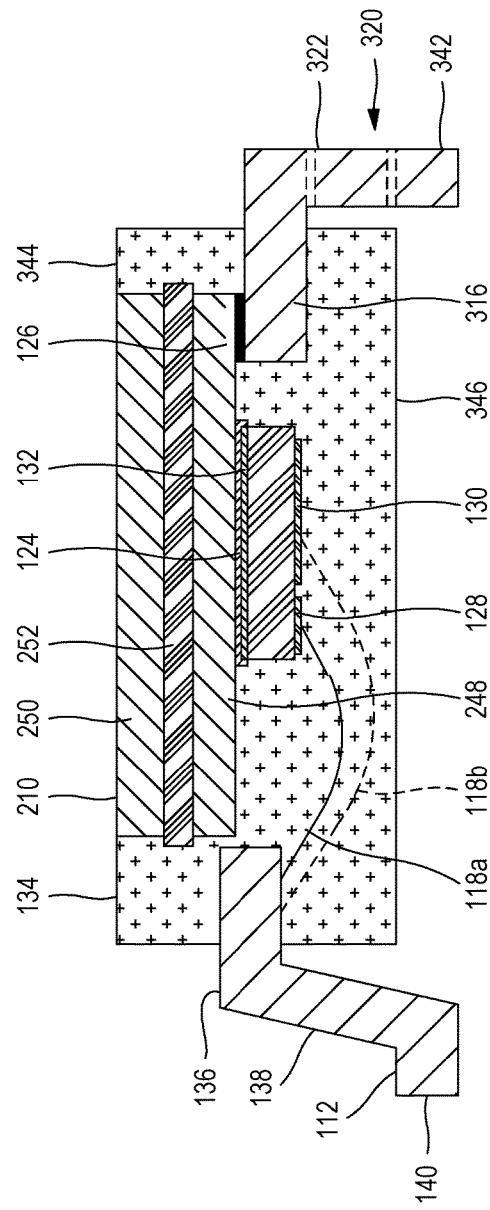

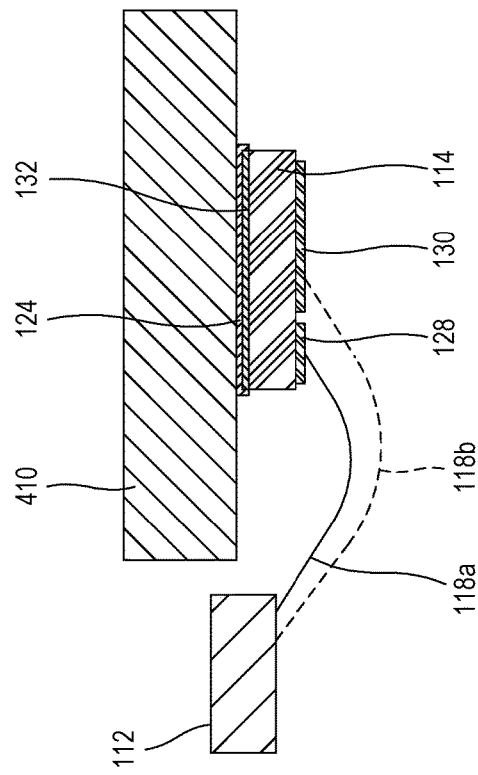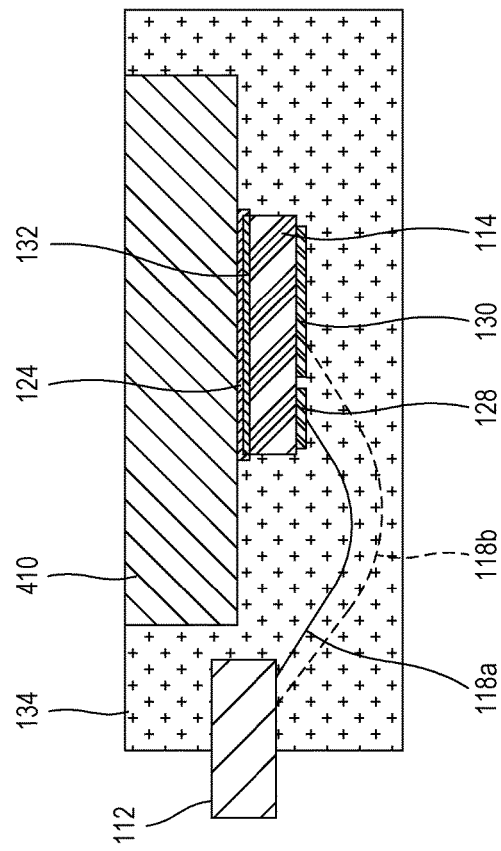

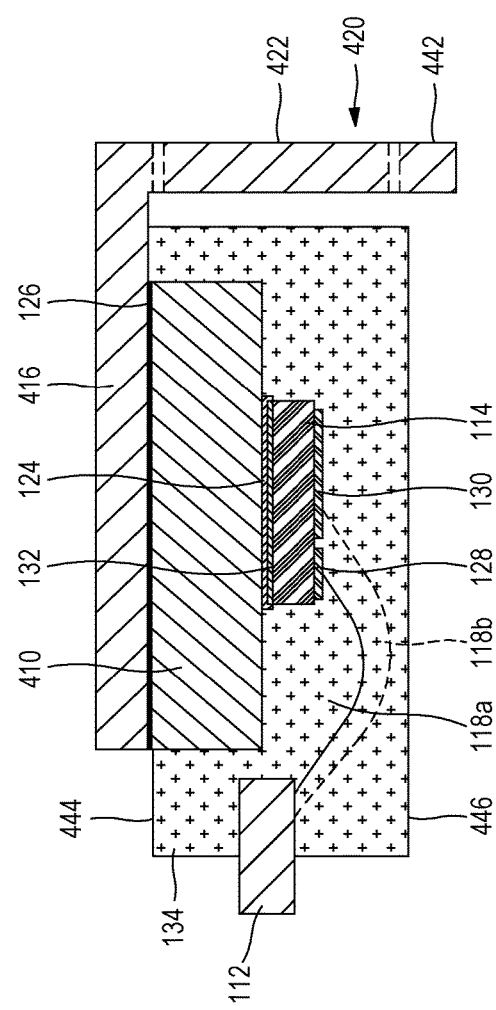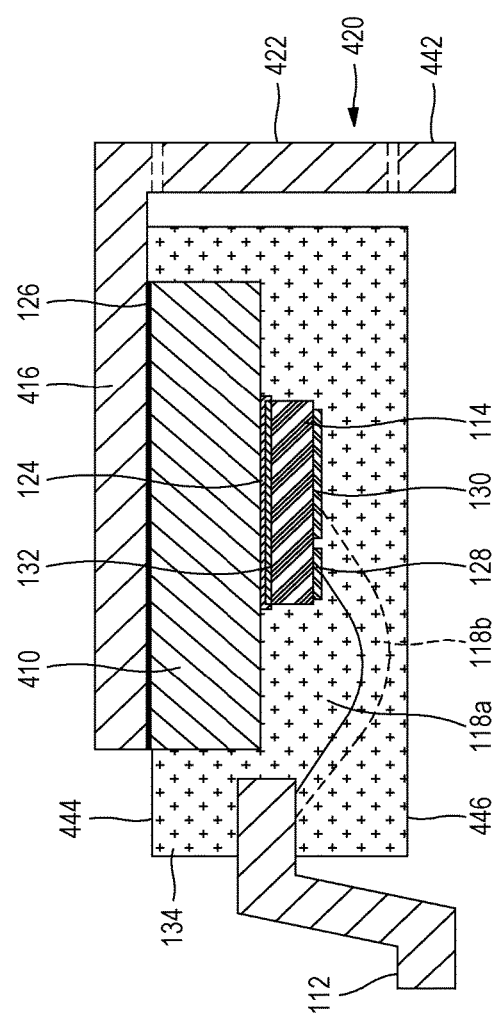
FIG.8D
FIG.8E

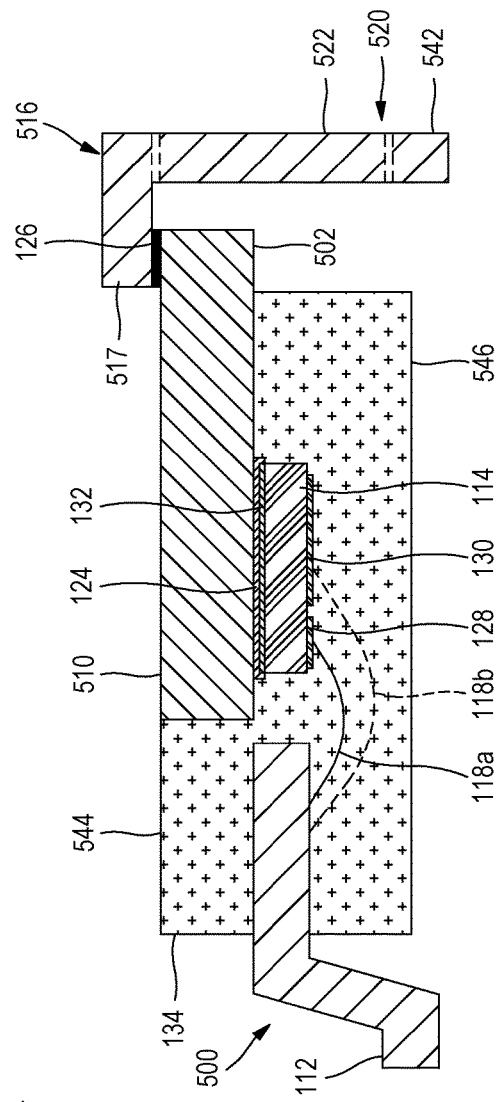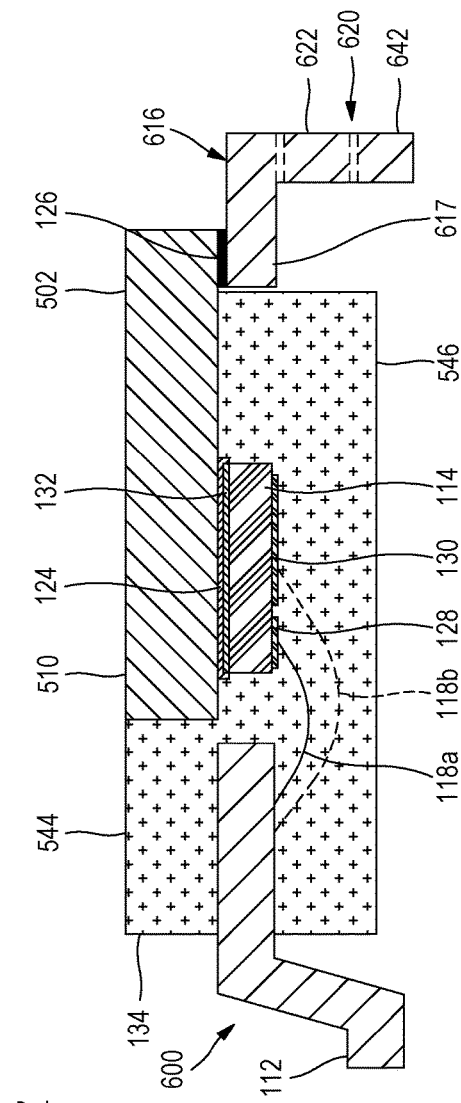
FIG.9A
FIG.9B

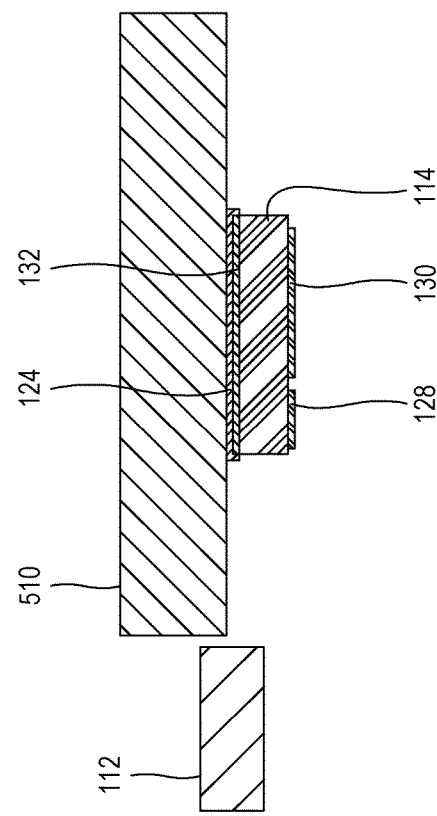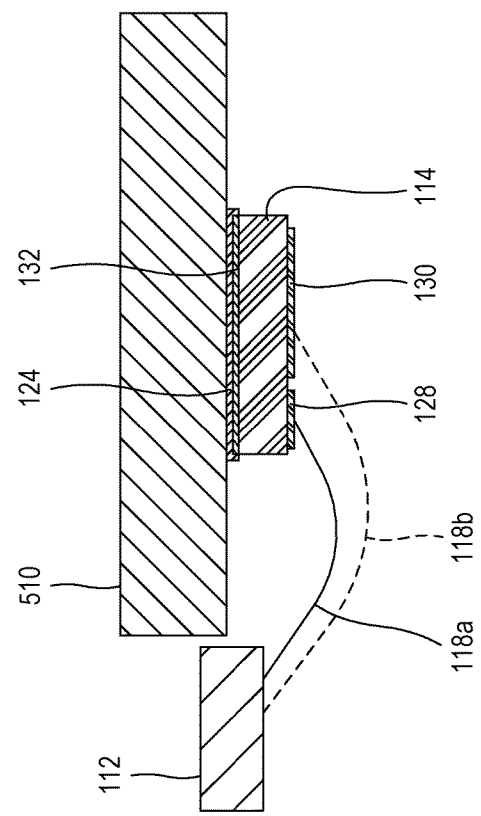

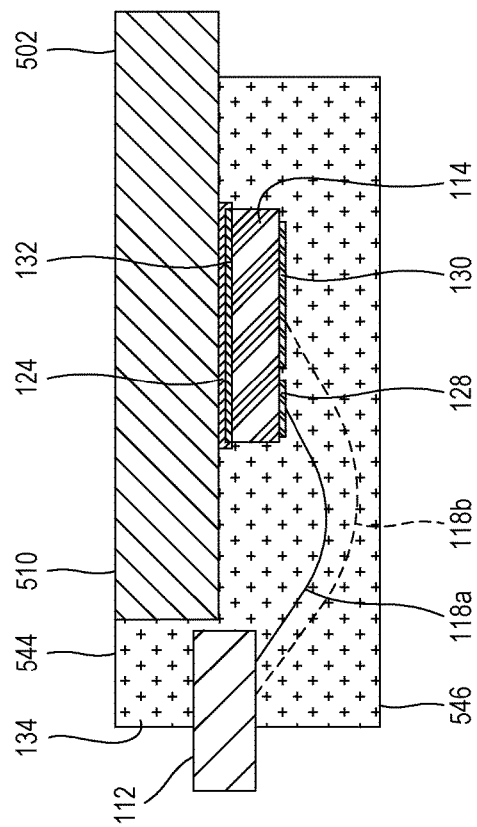
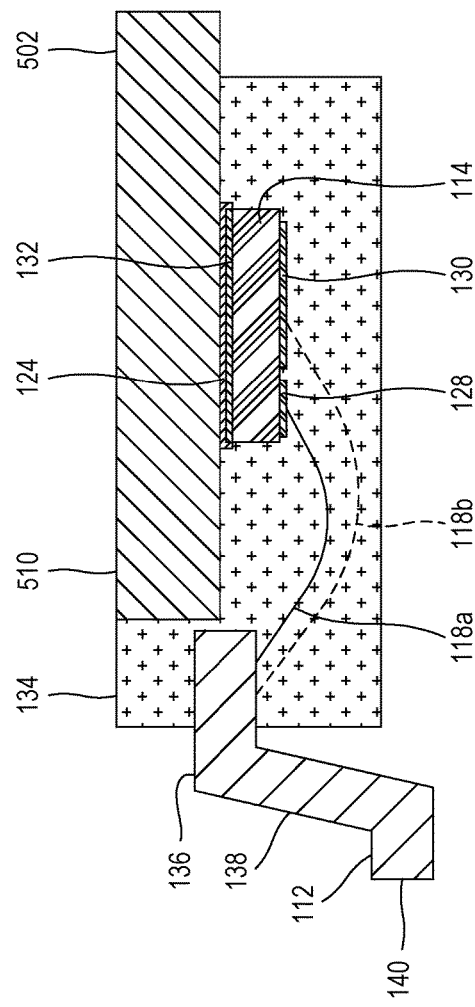
FIG.10C
FIG.10D

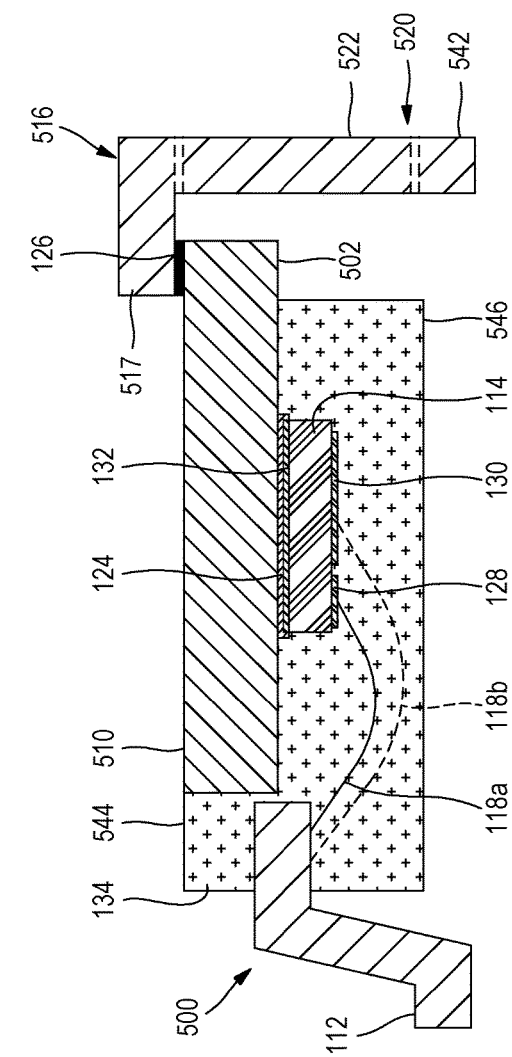
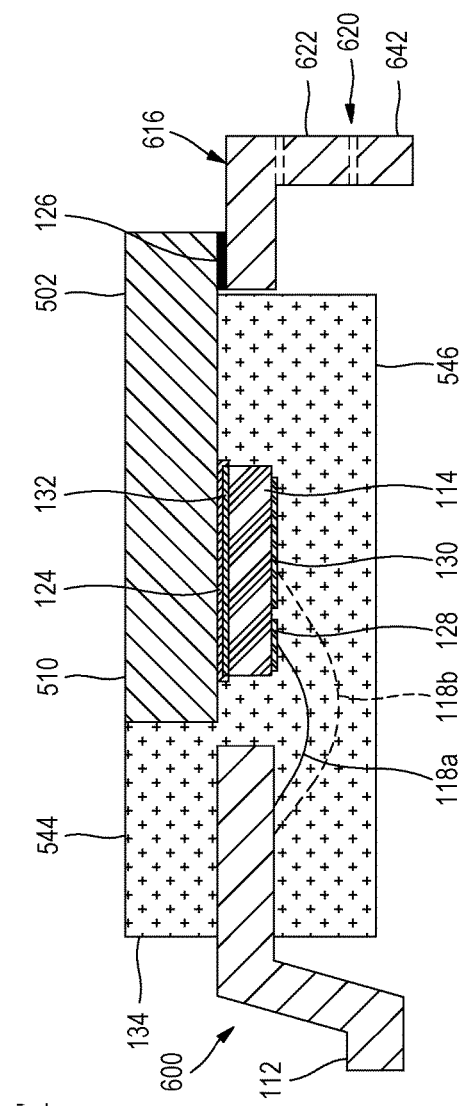

ELECTRONIC DEVICES AND METHODS OF MANUFACTURING ELECTRONIC DEVICES

CROSS-REFERENCE TO RELATED APPLICATIONS

The present applications claims the benefit of U.S. Application No. 63/448,241 filed Feb. 24, 2023. Said Application No. 63/448,241 is hereby incorporated herein by reference in its entirety.

TECHNICAL FIELD

The present disclosure relates, in general, to electronic devices, and more particularly, to electronic devices and methods for manufacturing electronic devices.

BACKGROUND

Prior electronic packages and methods for forming electronic packages are inadequate, resulting in, for example, excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 1A-1B show a cross-sectional view and a bottom view of an example electronic device.

FIGS. 2A-2E show cross-sectional views of an example method of manufacturing an example electronic device as shown in FIGS. 1A-1B.

FIGS. 3A-3F show cross-sectional views and bottom views of example electronic devices.

FIGS. 4A-4H show cross-sectional views of an example method of manufacturing example electronic devices as shown in FIGS. 3A-3F.

FIGS. 6A-6E show cross-sectional views of an example method of manufacturing an example electronic device as shown in FIG. 5.

FIGS. 8A-8E show cross-sectional views of an example method of manufacturing an example electronic device as shown in FIG. 7.

FIGS. 9A-9C show cross-sectional views and a bottom view of an example electronic device.

FIGS. 10A-10F show cross-sectional views of an example method of manufacturing an example electronic device as shown in FIGS. 9A-9B.

Figure 2E:
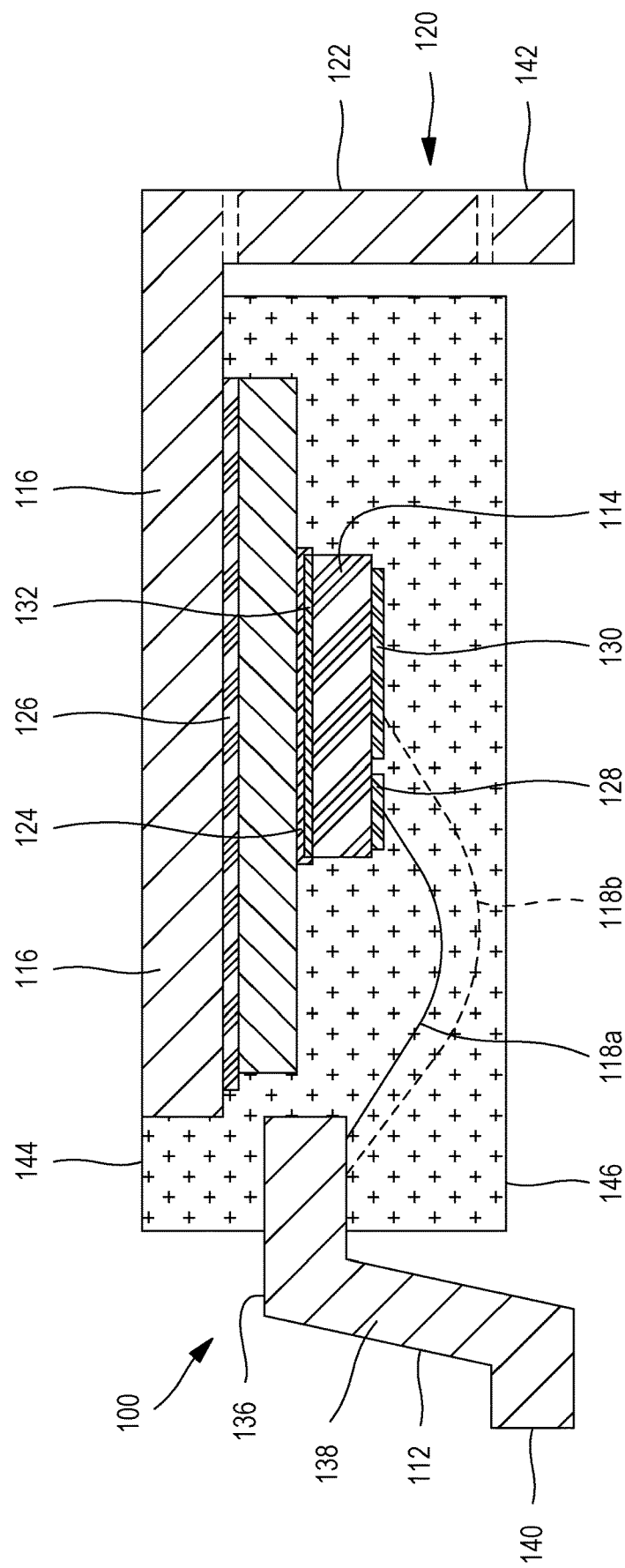

The following discussion provides various examples of electronic devices and methods of manufacturing electronic devices. Such examples are non-limiting, and the scope of the appended claims should not be limited to the particular examples disclosed. In the following discussion, the terms "example" and "e.g.," are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set $\{(x), (y), (x, y)\}$. As another example, "x, y, or z" means any element of the seven-element set $\{(x), (y), (z), (x, y), (x, z), (y, z), (x, y, z)\}$.

The terms "comprises," "comprising," "includes," and "including" are "open ended" terms and specify the presence of stated features, but do not preclude the presence or addition of one or more other features. The terms "first," "second," "third," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly coupled by one or more other elements. For example, if element A is coupled to element B, then element A can be directly contacting element B or indirectly coupled to element B by an intervening element C. As used herein, the term "coupled" can refer to an electrical coupling or a mechanical coupling. The terms "over" or "on" may be used to describe two elements directly contacting each other or describe two elements indirectly coupled by one or more other elements.

DESCRIPTION

In one example, an electronic device comprises a substrate structure, comprising a base comprising a top side and a bottom side, a first lead, and a flag comprising a top side, a bottom side, and a flag lead. The electronic device also comprises an electronic component comprising a top side and a bottom side, a first electrode at the bottom side of the electronic component, and second electrode at the top side of the electronic component, an encapsulant contacting a lateral side of the electronic component and a lateral side of the base, and a first interconnect in the encapsulant, coupled between the first electrode and the first lead. The second electrode is coupled with the flag lead via the base. Other examples and related methods are also disclosed herein.

In another example, a method of manufacturing an electronic device comprises providing a base comprising a top side and a bottom side, and a first lead, providing an electronic component coupled with the base and comprising a top side and a bottom side, a first electrode at the bottom side of the electronic component, and second electrode at the top side of the electronic component, providing a flag comprising a top side, a bottom side, and a flag lead, providing a first interconnect coupled between the first electrode and the first lead, and providing an encapsulant contacting a lateral side of the electronic component and a lateral side of the base and covering the first interconnect. The second electrode is coupled with the flag lead via the base.

Other examples are included in the present disclosure. Such examples can be found in the figures, in the claims, or in the description of the present disclosure.

FIGS. 1A-1B show a cross-sectional view and a bottom view, respectively, of an example electronic device 10. In the example shown in FIG. 1A and FIG. 1B, electronic device 10 can comprise substrate structure 100 comprising base 110, flag 116, and leads 112 and 120. In some examples, flag 116 can comprise a conductive material such as copper or a similar metal and can be referred to as, or can be part of, a leadframe. Similarly, in some examples, base 110 can comprise a similar conductive material and can be referred to as, or can be part of, a leadframe. In some examples, flag 116 can be attached to base 110 by bond 126 defined by a bonding process or conductive material. In some examples, the bottom side of flag 116 can be coupled with the top side of base 110. Electronic device 10 can include electronic component 114 which can comprise electrodes 128 and 130 on a first side of electronic component 114, and electrode 132 on a second side of electronic component opposite to the first side. In some examples, electrode 132 can be coupled with flag 116 via base 110. Electronic component 114 can be coupled with a first side of base 110 by bond 124. In some examples, a material of bond 124 can be similar to the material options of bond 126. In some examples, bond 124 can comprise a conductive material to electrically or thermically couple electrode 132 of electronic component with base 110. Similarly, bond 126 can comprise a conductive material to electrically or thermally couple base 110 with flag 116.

In some examples, lead 112 can comprise a ledge 136, downset 138, and foot 140. Lead 112 can be coupled with electronic component 114, for example interconnect 118a can couple a first lead 112 with a first electrode of electronic component 114, for example electrode 128. Similarly, interconnect 118b can couple a second lead 112 with a second electrode of electronic component 114, for example electrode 130. Additional interconnects 118c and 118d as shown in FIG. 1B can couple one or more leads such as a second lead 112 to an electrode of electronic component 114, for example electrode 130. A third electrode of electronic component 114, for example electrode 132, can be coupled with lead 120 via base 110 and flag 116. Lead 120 can comprise ledge 121, downset 122 and foot 142. Electronic device 10 can comprise encapsulant 134 encapsulating electronic component 114, interconnects 118a-118d, base 110, and an internal portion of ledge 136. In some examples, encapsulant 134 can contact a lateral side of electronic component 114 and a lateral side of base 110. Flag 116 can be exposed from encapsulant 134 at device top side 144. In some examples, bond 126 between base 110 and flag 116 can be lower than device top side 144. In some examples, flag 116 can comprise flag outer ledge 120L that couples respective leads 120 to each other external to encapsulant 134. In some examples, foot 140 of lead 112 and foot 142 of lead 120 can extend beyond a device bottom side 146. In some examples, flag 116 can comprise multiple flag leads 120 such as two flag leads 120 shown in FIG. 1B. Flag 116 can be coupled to and overlap base 110, and two or more flag leads 120 can extend external to encapsulant 134 at the same side of encapsulant. In some examples, flag outer ledge 120L can be external to encapsulant 134 and can couple a first flag lead 120 with a second flag lead 120.

FIGS. 2A-2E show cross-sectional views of an example method of manufacturing an example electronic device as shown in FIGS. 1A-1B. FIG. 2A shows a cross section view of electronic device 10 at an early stage of manufacture. As shown in FIG. 2A, electronic component 114 can be attached to one side of base 110, for example using bond 124. In some examples, bond 124 can comprise an electrically conductive material such as solder, lead free solder, or a sinter comprising silver (Ag) or copper (Cu). In some examples, bond 124 can include tin (Sn), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, Sn—Ag—Cu, or equivalents thereof. In some examples, bond 124 can comprise an electrically conductive thermal-interface-material (TIM). In some examples, bond 124 can include inorganic heat dissipating coating composites having a high thermal conductive filler, for example aluminum nitride (AlN), boron nitride (BN), or silicon carbide (SiC), etc.) fused with a binder (e.g., a polymer resin). In the same or other some examples, bond 124 can comprise thermal conductive coat materials including a heat-resistant binder prepared by a sol-gel process, a thermally conductive material, and additives, and can have a high thermal conductivity of approximately 100 watts per meter-kelvin (W/m-K) to 400 W/m-K.

Electrode 128 and electrode 130 of electronic component 114 can be exposed to face away from base 110, and electrode 132 of electronic component 114 can face toward base 110 and can be coupled with base 110 via bond 124. Base 110 can also include one or more leads 112 not yet formed into a final shape. In some examples, electronic component 114 can comprise an active device such as a metal-oxide-semiconductor field-effect (MOSFET) transistor. In such examples, electrode 128 can comprise a gate electrode, electrode 130 can comprise a source electrode or a drain electrode, and electrode 132 can comprise a source electrode or a drain electrode. In some examples, electronic component 114 can be a logic die, a micro control unit, a memory, a digital signal processor, a network processor, a power management unit, an audio processor, a radio-frequency (RF) circuit, a wireless baseband system on chip processor, an application specific integrated circuit, or an equivalent thereof. It should be noted that these are merely examples embodiments for electronic component 114, and the scope of the disclosed subject matter is not limited in these respects.

FIG. 2B shows a cross section view of electronic device 10 at a later stage of manufacture. After electronic component 114 is attached to base 110, flag 116 can be attached to base 110 on a side of base 110 opposite to electronic component 114. Flag 116 can be attached to base 110 via bond 126 or a bonding process. Bond 126 can comprise an electrically or thermally conductive material such as solder, lead free solder, or a sinter comprising silver or copper. The material of bond 126 can permit heat dissipation from electronic component through base 110 and flag 116. In some examples, flag 116 can be welded to base 110. Flag 116 can comprise lead 120 having downset 122 and foot 142 not yet formed into a final shape.

FIG. 2C shows a cross section view of electronic device 10 at a later stage of manufacture. One or more leads 112 can be coupled with electronic component 114 using one or more interconnects such as interconnects 118a and interconnects 118b. In some examples, interconnect 118a can couple with electrode 128, and interconnect 118b can couple with electrode 130, for example using a wire bonding process. Additional interconnects 118c and 118d, as shown in FIG. 1B above, can couple one or more electrodes of electronic component 114 with one or more leads 112. Interconnects 118a-118d can comprise various materials such as aluminum, copper, silver, or gold. In some examples, respective interconnects 118 can comprise one or more wires, clips, straps, or ribbons of conductive material.

FIG. 2D shows a cross section view of electronic device 10 at a later stage of manufacture. Encapsulant 134 can be provided to cover respective portions of base 110, electronic component 114, electrode 128, electrode 130, interconnects 118a-118d, or leads 112. In some examples, flag 116 can be exposed from encapsulant 134 at a device top side 144.

In some examples, encapsulant 134 can comprise epoxy molding compound (EMC) or a similar material, for example an epoxy molding resin, or a sealant. In addition, in some examples, encapsulant 134 can comprise or be referred to as a molding part, a sealing part, an encapsulation part, a protection part, or a package body. In some examples, encapsulant 134 can comprise, but is not limited to, an organic resin, an inorganic filler, a curing agent, a catalyst, a colorant, a flame retardant, and so on. In some examples, encapsulant 134 can be produced by, but not limited to, compression molding, transfer molding, liquid-phase encapsulant molding, vacuum lamination, paste printing, or film assisted molding. In some examples encapsulant 134 can have a thickness in the range from approximately 200 micrometers (μm) to approximately 10,000 μm.

FIG. 2E shows a cross section view of electronic device 10 at a later stage of manufacture. In some examples, one or more of leads 112 can be shaped or trimmed to result in a final shape comprising ledge 136, downset 138, and foot 140. A first portion of ledge 136 can extend internal to encapsulant 134, and a second portion of ledge 136 can extend external to encapsulant 134. Similarly, one or more of leads 120 can be formed or trimmed to result in a final shape comprising downset 122 and foot 142. In some examples, foot 140 of lead 112 and foot 142 of lead 120 can extend below device bottom side 146.

FIGS. 3A-3F show cross-sectional views and bottom views of example electronic devices 20 and 20'. FIG. 3A shows a cross-sectional view of electronic device 20 wherein flag 216 extends along a central portion of package body 134 substrate structure 200. FIG. 3B shows a cross-section view of electronic device 20' wherein flag 216 extends along an upper portion of substrate structure 200 package body 134. In some examples, electronic device 20 is similar to electronic device 20' with the difference being the vertical location of flag 216 substrate structure 200. FIGS. 3C-3F show bottom views of various embodiments of electronic device 20 or electronic device 20' with the differences being the mechanism by which flag 216 is coupled with base 210 as discussed in further detail below. In some examples, the formation, materials, or structures of electronic devices 20 and 20' of FIGS. 3A-3F can be the same or similar as the formation, materials, or structures of electronic device 10 of FIG. 1A and FIG. 1B.

In the examples shown in FIG. 3A and FIG. 3B, substrate structure 200 can comprise base 210, flag 216, lead 112, and leads 220. In some examples, base 210 can be same or similar to base 110. There can be examples where base 210 can be a single piece of conductive material, such as copper or other metal material. There can be examples where base 210 can comprise base bottom component 248, base top component 250, or intermediate layer 252 which can be referred to as a base intermediate layer. In some examples, base top component 250 can be coupled with base bottom component 248, for example via intermediate layer 252 or via direct coupling without using intermediate layer 252. In some examples, base 210 can comprise an active metal brazed (AMB) substrate or a direct bond copper (DBC) substrate. In some examples, intermediate layer 252 can comprise a dielectric material with good thermal conductivity, such as a ceramic like alumina, aluminum nitride or silicon nitride. In some examples, base bottom component 248 can be attached to base top component 250 via welding, for example using an ultrasonic (US) welding process or a laser welding process wherein the weld comprises intermediate layer 252. In some examples, base bottom component 248 can be attached to base top component 250 via soldering, for example where intermediate layer 252 comprises sinter, wherein the solder can comprise intermediate layer 252. In some examples, base bottom component 248 and intermediate layer 252 can be in encapsulant 134, and the top side of base top component can be exposed from the top side of encapsulant 134. Electronic component 114 can be coupled with base 210, for example using bond 124 which can comprise an electrically conductive material as previously described. One or more leads 112 can be coupled with one or more electrodes of electronic component 114. Encapsulant 134 can at least partially encapsulate base 210, electronic component 114, lead 112, flag 216, and lead 220. In some examples, flag 216 of electronic device 20 and flag 216 of electronic device 20' can be adjacent to base 210 and can couple with base 210 as shown in FIGS. 3C-3F. In some examples, flag 216 can be below a top side of encapsulant 134 as shown in FIG. 3A, or flag 216 can be substantially flush with the top side of encapsulant 134 as shown in FIG. 3B.

In the examples shown in FIGS. 3C-3F, substrate structure 200 is shown from a bottom view perspective. Base bottom side 248 is visible from this bottom view perspective as viewed from device bottom side 246. Electronic component 114 can be disposed at a central region of base 210. Base 210 and flag 216 can comprise various shapes or configurations as shown, and flag 216 can coupled with base 210 using various mechanisms as shown. In some examples, flag 216 can be spaced apart from base 210, and flag 216 can be coupled with base 210 via one or more interconnects in encapsulant 134, for example wires, clips or straps, of ribbons as discussed in further detail below.

FIG. 3C shows flag 216 adjacent to base 210 at an outside perimeter of base 210 and disposed at opposite sides of base 210. In some examples, flag 216 can comprise at least one flag leg 217, or anchor or extension, and base 210 can have a border or indentation shaped to correspond with or to accommodate the corresponding flag leg 216L of flag 216. In the present example, from the viewpoint shown in FIG. 3C, flag 216 comprises two flag legs 217 joined together by an inner ledge 217L, and two adjacent sides of flag legs 217 of flag 216 are bordered by the border of base 210. In some examples, flag 216 can comprise a notch 216n, such as a protrusion or a groove, and base 210 can have a notch 210n shaped to correspond to the notch of flag 216. For example, the notch of flag 216 can be a protrusion and the notch of base 210 can be a groove, where the protrusion notch of flag 216 extends towards the groove notch of base 210, or vice-versa. The flag legs 217 can permit further securing or anchoring of flag 216 to encapsulant 134 than would be otherwise possible if flag 216 were relying only on inner ledge 217L. In some examples, the notches 216n or 210n can provide further securing or anchoring of flag 216 or base 210 to encapsulant 134.

Flag 216 can couple with base 210 using one or more interconnects such as conductive wires, straps, clips or ribbons. For example, interconnects 258 can represent wires, interconnects 260 can represent clips or straps, or interconnects 262 can represent conductive ribbons. Although one or more interconnects 258, 260, 262, it is noted that any combination of interconnects 258, 260, 262 can be utilized. Furthermore, it should be noted that interconnects 258, 260, 262 can be interchangeable with one another. For example, only wire interconnects can be used, only clip or strap interconnects can be used, only ribbon interconnects can be used, or any combination thereof, to couple flag 216 with base 210. Base 210 and flag 216 can be at least partially encapsulated by encapsulant 134. In some examples, flag 216 can comprise outer ledge 220L that can extend external to encapsulant 134 and can couple leads 220 together. Leads 220 can include downset 222 and foot 242. Inner portions of leads 112 can be encapsulated by encapsulant 134, and outer portions of leads 112 can be exposed from encapsulant 134. In some examples, a first portion of flag 216 can be covered by encapsulant 134 and a second portion of flag 216 can be exposed from encapsulant 134. In some examples, the inner ledge 217L of flag 216 can be covered by encapsulant 134 and can be coupled with leads 220 external to encapsulant 134.

FIG. 3D shows flag legs 217 of flag 216 partially disposed within an external perimeter of base 210 and coupled with base 210 using interconnects such as interconnects 258, 260. In some examples, a portion of the flag legs 217 of flag 216 can be interposed within the external perimeter of base 210 without contacting base 210. For example, each flag leg 217 of flag 216 can be flanked on two opposite sides by the border or indentation of base 210 as shown from the viewpoint of FIG. 3D. In some examples, a first portion of flag 216 can be covered by encapsulant 134 and a second portion of flag 216 can be exposed from encapsulant 134. In some examples, leads 220 can be coupled to each other external to encapsulant 134 by outer ledge 220L of flag 216.

FIG. 3E shows flag 216 with inner ledge 217L disposed outside of the external perimeter of base 210. In the present example, flag 216 need not comprise flag legs 217, and the border of base 210 can extend to encompass the footprint of the flag legs 217 of FIG. 3C, 3D, or 3F. In some examples, flag 216 can be coupled with base 210 using any of interconnects 258, 260, 262. Flag 216 can be disposed along one external perimeter side of base 210 without extending along any other external perimeter side of base 210. In some examples, inner ledge 217L of flag 216 is covered by encapsulant 134 and outer ledge 220L of flag 216 is exposed from encapsulant 134. In some examples, inner ledge 217L of flag 216 can be covered by encapsulant 134 and can couple leads 220 or with outer ledge 220L external to encapsulant 134.

FIG. 3F shows flags 216 disposed adjacent to base 210 and at an outside perimeter of base 210 and disposed at opposite sides of base 210. In some examples, flags 216 can comprise flag leg 217, and base 210 can have a border or indentation shaped to correspond with or to accommodate the corresponding flag legs 217 of flags 216. In the present example, from the viewpoint shown in FIG. 3F, flags 216 comprise respective flag legs 217, and opposite sides of base 210 are bordered by flag legs 217.

Flags 216 can comprise one or more tabs 202 extending from the flag legs 217, as shown in FIG. 3F. In some examples, flags 216 can be coupled with base 210 using multiple interconnects 258, 260. Leads 220 can extend from each of the flag legs 217 of flag 216, respectively. The flag legs 217 of flag 216 can be separate from each other, such as where inner ledges 217L of flags 216 lack a common bridge coupling the flag legs 217 internal to encapsulant 134. For instance, as shown in FIG. 3F, the flag legs 217 of flag 216 can comprise or be coupled to respective inner ledges 217L of flags 216 internal to encapsulant 134, but such inner ledges 217L do not bridge the flag legs 217 to each other. In some examples, leads 220 can be separate from each other, such as where flags 216 lacks an outer ledge 220L bridging leads 220 external to encapsulant 134. Various other configurations of base 210 and flag 216 can be provided, and various arrangements of interconnects 258, clips 260, or ribbons 262 also can be provided, and the scope of the disclosed subject matter is not limited in these respects.

FIGS. 4A-4H show cross-sectional views of an example method of manufacturing example electronic devices 20 and 20' as shown in FIGS. 3A-3F. FIG. 4A shows a cross section view of electronic device 20 or 20' at an early stage of manufacture. In some examples, features, materials, and operations of FIGS. 4A-4H can be the same or similar as corresponding ones of FIGS. 2A-2E.

Electronic component 114 can be attached to one side of base 210, for example to base bottom component 248. Electronic component 114 can be coupled with base 210, for example using bond 124 which can comprise an electrically conductive material as previously described. Electrode 128 and electrode 130 of electronic component 114 can be exposed and face away from base 210, and electrode 132 of electronic component 114 can face toward base 210 and can be coupled with base 110 via bond 124.

FIG. 4B shows a cross section view of electronic device 20 or 20' at a later stage of manufacture. Flag 216, one or more leads 112, and one or more leads 220, can be mounted or arranged adjacent to base 210. Leads 112 and leads 220 are shown extended further laterally before being shaped or trimmed at a later stage of manufacture. In some examples, base 210 can comprise a portion of a first leadframe, and flag 216, leads 220 or leads 112 can comprise respective portions of a second leadframe mounted or arranged with the first leadframe. Note that in some examples FIGS. 4A and 4B can be combined, where base 210, flag 216, leads 220 or leads 112 can comprise respective portions of a same leadframe.

FIGS. 4C, 4D, and 4E are represent alternative operations where one or more of such operations can be carried out. FIG. 4C shows a cross section view of electronic device 20 or 20' at a stage of manufacture after FIG. 4B. The operation of FIG. 4C can be made when one or more interconnects 258, which can comprise wire interconnects, are provided to couple flag 216 with base 210, for example using a wire bonding technique. Interconnects 258 can comprise a conductive metal such as aluminum, copper, gold, or silver.

FIG. 4D shows a cross section view of electronic device 20 or 20' at a stage of manufacture after FIG. 4B. The operation of FIG. 4D can be made when one or more interconnects 260, which can comprise one or more conductive clips or straps, are provided to couple flag 216 with base 210. Interconnects 260 can connect to base 210 and flag 216 using solder, lead free solder, or a sinter comprising silver or copper, or by welding.

FIG. 4E shows a cross section view of electronic device 20 or 20' at a stage of manufacture after FIG. 4B. The operation of FIG. 4E can be made when one or more interconnects 262, which can comprise one or more conductive ribbons, are provided to couple flag 216 with base 210. Interconnects 262 can comprise a conductive material such as copper, aluminum, gold, or silver.

FIG. 4F shows a cross section view of electronic device 20 or 20' at a later stage of manufacture. In some examples, the operation of FIG. 4F can be carried out before or concurrently with the operation of FIG. 4C, 4D, or 4E. One or more leads 112 can be coupled with electronic component 114 using one or more 118a or 118b, similar to as described with respect to FIG. 2C.

FIG. 4G shows a cross section view of electronic device 20 or 20' at a later stage of manufacture. Encapsulant 134 can at least partially encapsulate base 210, electronic component 114, leads 112, flag 216, and leads 220. In some examples, flag 216 of electronic device 20 or flag 216 of electronic device 20' can be positioned adjacent to base 210, such as respectively shown in FIG. 3A or 3B, and can be coupled with base 210 as shown in FIGS. 3C-3F. Base 210 can be exposed at a top side of encapsulant 134.

FIG. 4H shows a cross section view of electronic device 20 or 20' at a later stage of manufacture. In some examples, one or more of leads 112 can be shaped or trimmed to result in a final shape comprising ledge 136, downset 138, and foot 140. An inner portion of ledge 136 can extend internal to encapsulant 134, and an outer portion of ledge 136 can extend external to encapsulant 134. Similarly, one or more of leads 220 can be formed or trimmed to result in a final shape comprising downset 222 and foot 242. In some examples, foot 140 of lead 112 and foot 242 of lead 220 can extend below device bottom side 246.

Figure 5:
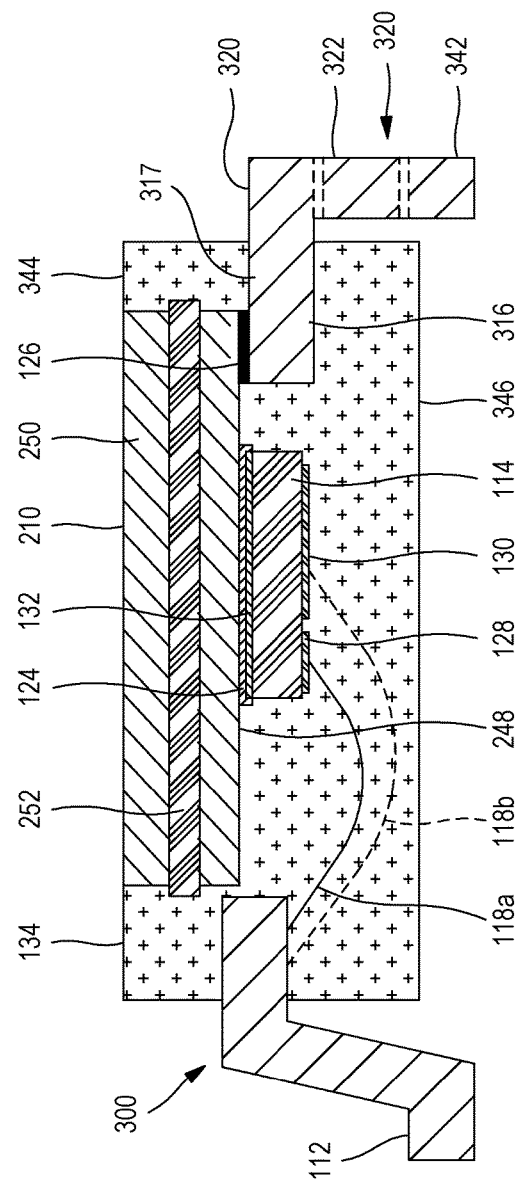
FIG. 5 shows a cross-sectional view of an example electronic device.

FIG. 5 shows a cross-sectional view of an example electronic device 30. Electronic device 30 can be similar to electronic device 20 or 20', and can comprise flag 316 having ledge 317 coupled with a bottom side of base 210. In some examples, the top side of flag 316 can be coupled with the bottom side of base 210 via bond 126. In some examples, the bond 126 can be lower than a top side of encapsulant 134. In some examples, ledge 317 of flag 316 can be similar to inner ledge 217L or outer ledge 220L described with respect to the embodiments of FIG. 3. For instance, ledge 317 can bridge or couple multiple leads 320. In some examples, ledge 317 can be a ledge of lead 320 that extends to couple with base 210. For instance, multiple leads 320 can couple to base 210 with respective ledges 317. Base 210 can be exposed from encapsulant 134 at device top side 344. In some examples, an inner portion of flag 316 can be internal to encapsulant 134, and an outer portion of flag 316 can be external to encapsulant 134. Lead 320 can be external to encapsulant 134 and can include downset 322 and foot 342. In some examples, lead 112 and foot 342 of lead 320 can extend below device bottom side 346. In some examples, the formation, features, materials, or structures of electronic device 30 of FIG. 5 can be the same or similar as those of electronic device 10 of FIGS. 1-2 or electronic device 20 or 20' of FIGS. 3-4.

Figure 6A:
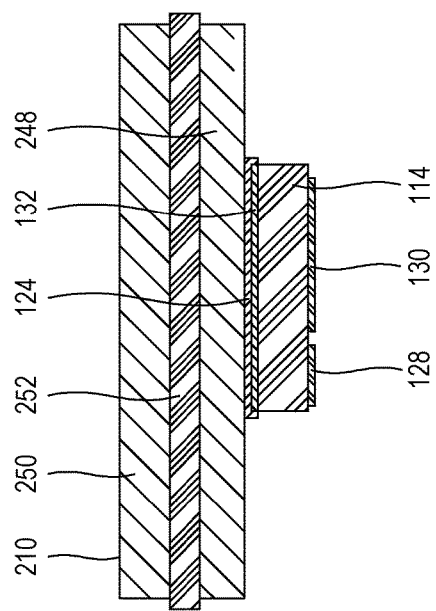

FIGS. 6A-6E show cross-sectional views of an example method of manufacturing an example electronic device 30 as shown in FIG. 5. FIG. 6A shows a cross section view of electronic device 30 at an early stage of manufacture. In some examples, features, materials, or operations of FIG. 6A can be the same or similar as those of FIG. 2A. or 4A.

Figure 6B:
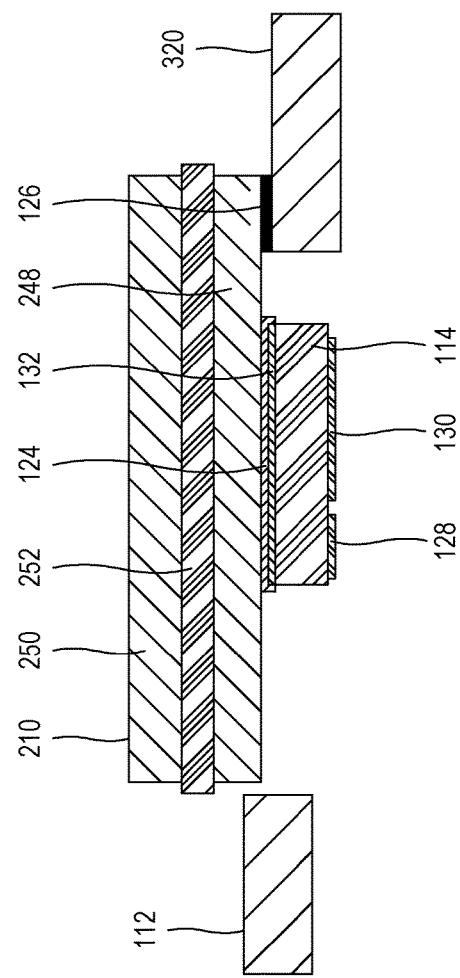

FIG. 6B shows a cross section view of electronic device 30 at a later stage of manufacture. Flag 316, one or more leads 112, and one or more leads 320, can be mounted adjacent to base 210. The inner ledge of flag 316 can be bonded via bond 126 to the bottom side of base 210, such as by soldering or welding. Leads 112 and leads 320 extend laterally before being shaped or trimmed at a later stage of manufacture. In some examples, features, materials, or operations of FIG. 6B can be the same or similar as those of FIG. 2B. or 4B.

Figure 6C:
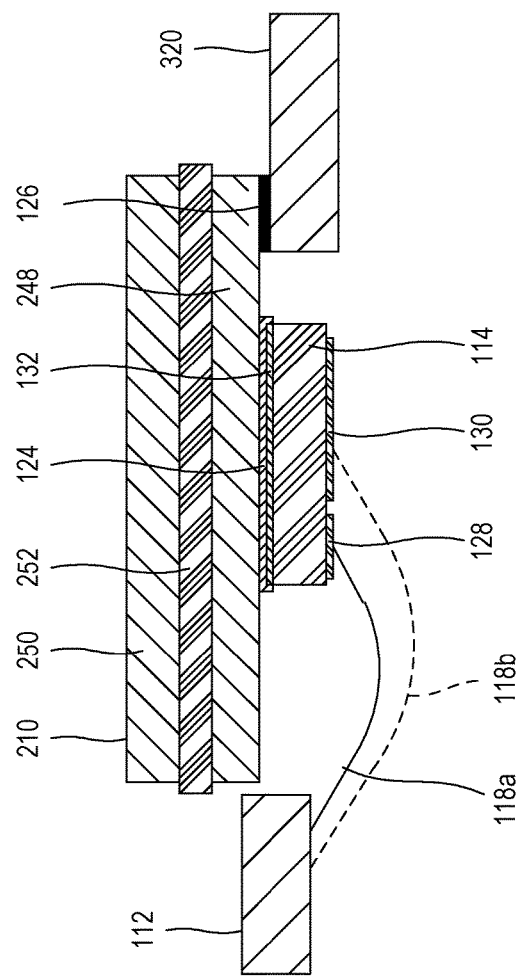

FIG. 6C shows a cross section view of electronic device 30 at a later stage of manufacture. One or more leads 112 can be coupled with electronic component 114 using one or more interconnects 118a, 118b. In some examples, interconnect 118a can couple with electrode 128, and interconnect 118b can couple with electrode 130, for example using an interconnect bonding process. Additional interconnects 118c and 118d can couple one or more electrodes of electronic component 114 with one or more leads 112. Interconnects 118a-118d can comprise various conductive materials such as aluminum, copper, silver, or gold. In some examples, features, materials, or operations of FIG. 6C can be the same or similar as those of FIG. 2C or 4F.

FIG. 6D shows a cross section view of electronic device 30 at a later stage of manufacture. Encapsulant 134 can at least partially encapsulate base 210, electronic component 114, lead 112, flag 316, and lead 320. In some examples, features, materials, or operations of FIG. 6D can be the same or similar as those of FIG. 2D or 4G.

FIG. 6E shows a cross section view of electronic device 30 at a later stage of manufacture. In some examples, one or more of leads 112 can be shaped or trimmed to result in a final shape comprising ledge 136, downset 138, and foot 140. An inner portion of ledge 136 can extend internal to encapsulant 134, and an outer portion of ledge 136 can extend external to encapsulant 134. Similarly, one or more of leads 320 can be formed or trimmed to result in a final shape comprising downset 322 and foot 342. In some examples, foot 140 of lead 112 and foot 342 of lead 320 can extend below device bottom side 346. In some examples, features, materials, or operations of FIG. 6E can be the same or similar as those of FIG. 2E or 4H.

Figure 7:
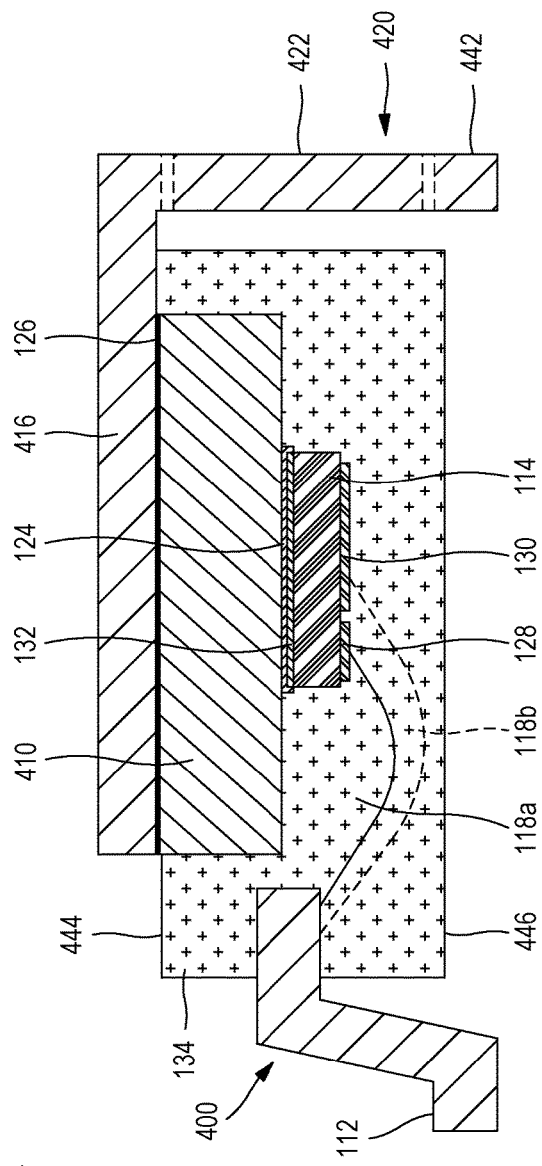
FIG. 7 shows a cross-sectional view of an example electronic device.

FIG. 7 shows a cross-sectional view of an example electronic device 40. In FIG. 7, substrate 400 can comprise base 410, flag 416, one or more leads 112, one or more leads 420, electronic component 114, and encapsulant 134. Lead 420 can comprise downset 422 and foot 442. One or more of leads 112 can be coupled with one or more electrodes of electronic component 114 via one or more interconnects such as interconnect 118a and interconnect 118b. In the example shown in FIG. 7, a bottom side of flag 416 can be coupled with a top side of base 410 at device top side 444 via adhesive 126 such that flag 416 is external to encapsulant 134. Such bottom side of flag 416 can be above or higher than the top side of encapsulant 134. In some examples, the top side of flag 416 can extend beyond a top side of encapsulant 134. In some examples, lead 112 and foot 442 of lead 420 can extend below device bottom side 446. In some examples, the formation, materials, or structures of electronic device 40 of FIG. 7 can be the same or similar as the materials or structures of electronic device 10 of FIG. 1A through FIG. 2E, electronic device 20 or 20' of FIG. 3A through FIG. 4H, or electronic device 30 of FIG. 5 through FIG. 6E.

Figure 8A:
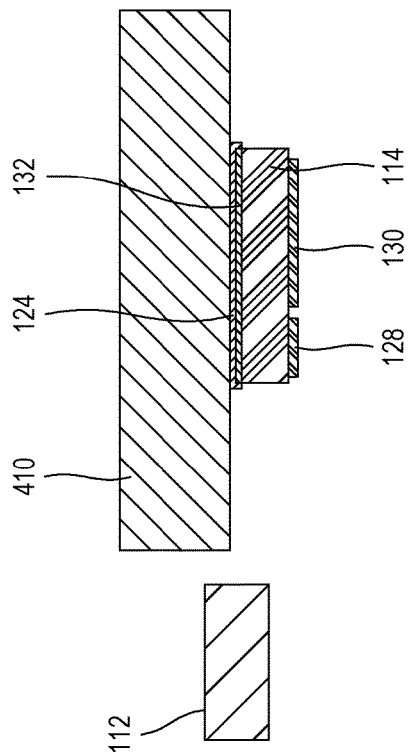

FIGS. 8A-8E show cross-sectional views of an example method of manufacturing an example electronic device as shown in FIG. 7. FIG. 8A shows a cross section view of electronic device 40 at an early stage of manufacture. In some examples, features, materials, or operations of FIG. 8A can be the same or similar as those of FIG. 2A. 4A, or 6A.

FIG. 8B shows a cross section view of electronic device 40 at a later stage of manufacture. One or more leads 112 can be coupled with electronic component 114 using one or more interconnects 118a-118b. In some examples, interconnect 118a can couple with electrode 128, and interconnect 118b can couple with electrode 130, for example using an interconnect bonding process. Additional interconnects 118c and 118d can couple one or more electrodes of electronic component 114 with one or more leads 112. Interconnects 118a-118d can comprise various conductive materials such as aluminum, copper, silver, or gold. In some examples, features, materials, or operations of FIG. 8B can be the same or similar as those of FIG. 2C, 4C, or 6C.

FIG. 8C shows a cross section view of electronic device 40 at a later stage of manufacture. Encapsulant 134 can at least partially encapsulate base 410, electronic component 114, and lead 112. In some examples, features, materials, or operations of FIG. 8C can be the same or similar as those of FIG. 2D, 4G, or 6D.

FIG. 8D shows a cross section view of electronic device 40 at a later stage of manufacture. Flag 416 can be mounted to base 410. The bottom side of flag 416 can be bonded via bond 126 to the top side of base 410, such as by soldering or welding. Leads 112 extend laterally before being shaped or trimmed at a later stage of manufacture. In some examples, features, materials, or operations of FIG. 8D can be the same or similar as those of FIG. 2B, 4B, or 6B.

FIG. 8E shows a cross section view of electronic device 40 at a later stage of manufacture. In some examples, one or more of leads 112 can be shaped or trimmed to result in a final shape as shown. Flag 416 can extend external to encapsulant 134. Optionally, one or more of leads 420 can be formed or trimmed to result in a final shape comprising downset 422 and foot 442. In some examples, the foot of lead 112 and foot 442 of lead 420 can extend below device bottom side 446. In some examples, features, materials, or operations of FIG. 8E can be the same or similar as those of FIG. 2E, 4H, or 6E.

Figure 9C:
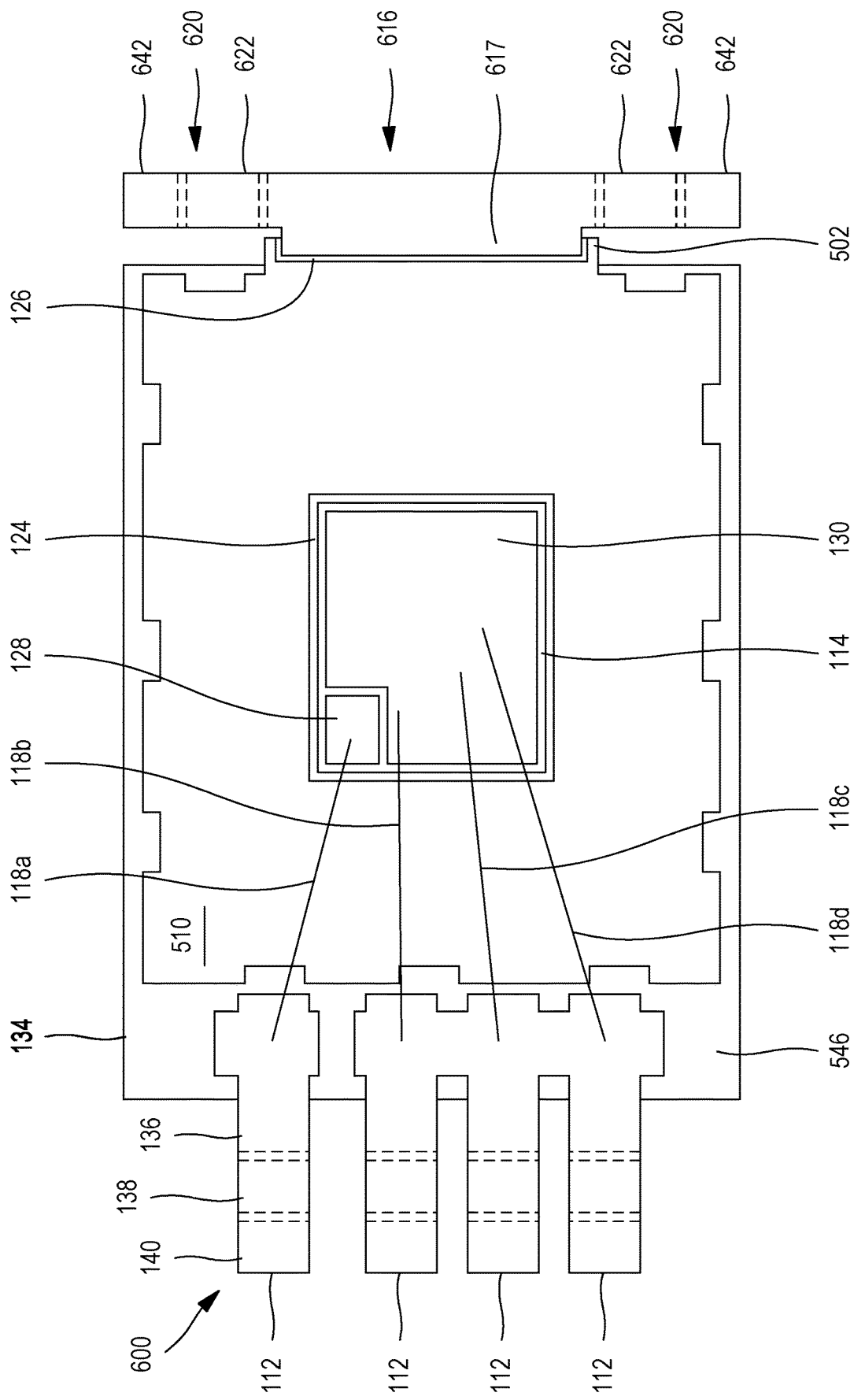

FIGS. 9A-9C show cross-sectional views and a bottom view of example electronic devices 50 and 50'. In FIG. 9A, electronic device 50 comprises encapsulant 134 and substrate 500 comprising base 510 having an extension 502 that extends beyond or external to encapsulant 134, for example where extension 502 protrudes beyond a lateral side of encapsulant 134. Electronic device 50 also comprises flag 516 having ledge 517 that is coupled with extension 502 of base 510 at a top side of base 510. In some examples, the bottom side of flag 516 can be coupled with the top side of base 510 at extension 502, for example via bond 126. In some examples, flag 516 can be fully external to encapsulant 134. In some examples, ledge 517 of flag 516 can be similar to inner ledge 217L or outer ledge 220L described with respect to the embodiments of FIG. 3. For instance, ledge 517 can bridge or couple multiple leads 520. In some examples, ledge 517 can be a ledge of lead 520 that extends to couple with base 510. For instance, multiple leads 520 can couple to base 510 with respective ledges 517. In some examples, flag 516 can be coupled to base 510 by a bond 126 comprising, for example provided by soldering, sintering, or welding. Electronic device 50 can comprise one or more leads 112, one or more leads 520, and electronic component 114. Lead 520 can comprise downset 522 and foot 542. One or more of leads 112 can be coupled with one or more electrodes of electronic component 114 via one or more interconnects such as interconnect 118a and interconnect 118b. In the example shown in FIG. 9A, the bottom side of the ledge of flag 516 can be coupled with the top side of extension 502 of base 510 at device top side 544. In some examples, a majority of the top side of base 510 can remain uncovered by the ledge of flag 16. Flag 516 can be entirely external to encapsulant 134, or can be separated from or without contact with encapsulant 134. In some examples, lead 112 and foot 542 of lead 520 can extend below device bottom side 546.

In FIG. 9B, electronic device 50' comprises encapsulant 134 and substrate 600 comprising base 510 having an extension 502 that extends beyond or external to encapsulant 134. Electronic device 50' also comprises flag 616 having a ledge that is coupled with extension 502 of base 510 at a bottom side of base 510. In some examples, the top side of flag 616 can be coupled with the bottom side of base 510 at extension 502, for example via bond 126. In some examples, flag 616 can be fully external to encapsulant 134. In some examples, ledge 617 of flag 616 can be similar to inner ledge 217L or outer ledge 220L described with respect to the embodiments of FIG. 3. For instance, ledge 617 can bridge or couple multiple leads 620. In some examples, ledge 617 can be a ledge of lead 620 that extends to couple with base 510. For instance, multiple leads 620 can couple to base 510 with respective ledges 617. In some examples, flag 616 can be coupled to base 510 by a bond 126 comprising, for example provided by soldering, sintering, or welding. Electronic device 50' can comprise one or more leads 112, one or more leads 620, and electronic component 114. Lead 620 can comprise downset 622 and foot 642. One or more of leads 112 can be coupled with one or more electrodes of electronic component 114 via one or more interconnects such as interconnect 118a and interconnect 118b. In the example shown in FIG. 9B, the top side of the ledge 617 of flag 616 can be coupled with the bottom side of extension 502 of base 510 at device top side 544. In some examples, flag 616 can be entirely external to encapsulant 134, or can be separated or without contact with encapsulant 134. In some examples, lead 112 and foot 642 of lead 620 can extend below device bottom side 546. In some examples, the formation, features, materials, or structures of electronic devices 50 and 50' of FIG. 9A and FIG. 9B can be the same or similar as the materials or structures of electronic device 10 of FIGS. 1-2, electronic device 20 or 20' of FIGS. 3-4, electronic device 30 of FIGS. 5-6, or electronic device 40 of FIGS. 7-8.

FIG. 9C is a bottom view of electronic device 50' as shown in FIG. 9B. In the example shown in FIG. 9C, a first lead 112 is coupled with electrode 128 of electronic component 114 via interconnect 118a. A group of three additional leads 112 are coupled with each other and coupled with electrode of 130 of electronic component 114 via interconnects 118b-118d. Ledge 617 of flag 616 can be coupled with extension 502 of base 510. Flag 616 can comprise leads 620 at opposite sides of ledge 617. In some examples, one or more components of electronic device 50' as shown in FIG. 9C can be the same as or similar to electronic device 10 of FIG. 1B.

FIGS. 10A-10F show cross-sectional views of an example method of manufacturing an example electronic device as shown in FIGS. 9A-9B. FIG. 10A shows a cross section view of electronic devices 50 and 50' at an early stage of manufacture. As shown in FIG. 10A, electronic component 114 can be attached to one side of base 510, for example using bond 124. similar In some examples, features, materials, or operations of FIG. 10A can be the same or similar as those of FIG. 2A, 4A, 6A, or 8A.

FIG. 10B shows a cross section view of electronic device 40 at a later stage of manufacture. One or more leads 112 can be coupled with electronic component 114 using one or more interconnects 118a or 118b. In some examples, interconnect 118a can couple with electrode 128, and interconnect 118b can couple with electrode 130, for example using a wire bonding process. Additional interconnects 118c and 118d (not shown) can couple one or more electrodes of electronic component 114 with one or more leads 112. Interconnects 118a-118d can comprise various materials such as aluminum, copper, silver, or gold. In some examples, features, materials, or operations of FIG. 10B can be the same or similar as those of FIG. 2C, 4F, 6C, or 8B.

FIG. 10C shows a cross section view of electronic devices 50 and 50' at a later stage of manufacture. Encapsulant 134 can be provided to cover a portion of base 510, electronic component 114 including electrode 128 and electrode 130, interconnects 118a-118b, and inner portions of one or more leads 112. The encapsulation can be carried out such that extension 502 of base 510 extends beyond or external to encapsulant 134. For example, the encapsulation can be facilitated by a molding chaise that leaves or covers extension 502 outside the molding area defined by the molding chaise. In some examples, encapsulant 134 can comprise epoxy molding compound (EMC) or a similar material. In some examples, features, materials, or operations of FIG. 10C can be the same or similar as those of FIG. 2D, 4G, 6D, or 8C.

FIG. 10D shows a cross section view of electronic devices 50 and 50' at a later stage of manufacture. In some examples, one or more of leads 112 can be shaped or trimmed to result in a final shape comprising ledge 136, downset 138, and foot 140. An inner portion of ledge 136 can extend internal to encapsulant 134, and an outer portion of ledge 136 can extend external to encapsulant 134. In some examples, foot 140 of lead 112 can extend below device bottom side 446. In some examples, features, materials, or operations of FIG. 10D can be the same or similar as those of FIG. 2E, 4H, 6E, or 8E.

FIG. 10E shows a cross section view of electronic device 50 of FIG. 9A at a later stage of manufacture. After encapsulant 134 is provided, flag 516 can be attached to base 510 on a top side of extension 502 of base 510. The bottom side of the ledge of flag 516 can be attached to the top side of extension 502 of base 510 by a bond 126 defined by, for example, welding or soldering. In some examples, welding can comprise ultrasonic welding or laser welding. In some examples, soldering can comprise solder, lead free solder, or sintering material. Flag 516 can include lead 520 comprising downset 522 and foot 542 shaped or trimmed into a final shape. In some examples, foot 542 of lead 520 can extend below device bottom side 546.

FIG. 10F shows a cross section view of electronic device 50' of FIG. 9B at a later stage of manufacture. After encapsulant 134 is provided, flag 616 can be attached to base 510 on a top side of extension 502 of base 510. The top side of the ledge of flag 616 can be attached to the bottom side of extension 502 of base 510 by a bond 126 defined by, for example, welding or soldering. In some examples, the welding can comprise ultrasonic welding or laser welding. In some examples, the soldering can comprise solder, lead free solder, or sintering material. Flag 616 can include lead 620 comprising downset 622 and foot 642 shaped or trimmed into a final shape. In some examples, foot 642 of lead 620 can extend below device bottom side 546.

The present disclosure includes reference to certain examples described herein. It will be understood by those skilled in the art, however, that various changes may be made, and equivalents may be substituted without departing from the scope of the disclosure. In addition, modifications may be made to the disclosed examples without departing from the scope of the present disclosure. Therefore, it is intended that the present disclosure is not limited to the examples disclosed, but that the disclosure will include all examples falling within the scope of the appended claims.

The invention claimed is:

1. An electronic device, comprising:
a substrate structure, comprising:
a base comprising a top side and a bottom side;
a first lead; and
a flag comprising a top side, a bottom side, and a flag lead;
an electronic component comprising a top side and a bottom side, a first electrode at the bottom side of the electronic component, and second electrode at the top side of the electronic component;
an encapsulant contacting a lateral side of the electronic component and a lateral side of the base; and
a first interconnect in the encapsulant, coupled between the first electrode and the first lead;
wherein the second electrode is coupled with the flag lead via the base.

2. The electronic device of claim 1, wherein:
the top side of the flag is exposed from a top side of the encapsulant.

3. The electronic device of claim 1, wherein:
the flag is coupled with the base via a bond; and
the bond is lower than a top side of the encapsulant.

4. The electronic device of claim 1, wherein:
the bottom side of the flag is coupled with the top side of the base; and
the top side of the flag extends beyond a top side of the encapsulant.

5. The electronic device of claim 1, wherein the base comprises:
a base bottom component; and
a base top component coupled with the base bottom component.

6. The electronic device of claim 5, wherein:
the base comprises a base intermediate layer between the base bottom component and the base top component;
the base bottom component and the base intermediate layer are in the encapsulant; and
a top side of the base top component is exposed from a top side of the encapsulant.

7. The electronic device of claim 1, wherein:
the top side of the flag is coupled with the bottom side of the base via a bond; and
the bond is lower than a top side of the encapsulant.

8. The electronic device of claim 1, comprising:
a second flag lead;
wherein:
the flag is coupled to the base and overlaps the base; and
the flag lead and the second flag lead extend external to the encapsulant at a same side of the encapsulant.

9. The electronic device of claim 1, wherein the flag comprises:
a second flag lead; and
a flag outer ledge that is external to the encapsulant and couples the flag lead with the second flag lead.

10. The electronic device of claim 1, wherein:
the base includes an extension that protrudes beyond a lateral side of the encapsulant.

11. The electronic device of claim 10, wherein:
the bottom side of the flag is coupled with the top side of the base at the extension.

12. The electronic device of claim 10, wherein:
the top side of the flag is coupled with the bottom side of the base at the extension.

13. The electronic device of claim 10, wherein:
the flag is fully external to the encapsulant.

14. The electronic device of claim 1, wherein:
the flag is spaced apart from the base; and
the flag is coupled with the base via a second interconnect in the encapsulant.

15. The electronic device of claim 14, wherein:
the second interconnect comprises at least one of a wire, a clip, a strap, or a ribbon.

16. The electronic device of claim 14, wherein:
the top side of the flag is substantially flush with a top side of the encapsulant.

17. The electronic device of claim 14, wherein:
the top side of the flag is below a top side of the encapsulant.

18. A method of manufacturing an electronic device, comprising:
providing a base comprising a top side and a bottom side, and a first lead;
providing an electronic component coupled with the base and comprising a top side and a bottom side, a first electrode at the bottom side of the electronic component, and second electrode at the top side of the electronic component;
providing a flag comprising a top side, a bottom side, and a flag lead;
providing a first interconnect coupled between the first electrode and the first lead; and
providing an encapsulant contacting a lateral side of the electronic component and a lateral side of the base and covering the first interconnect;
wherein the second electrode is coupled with the flag lead via the base.

19. The method of claim 18, wherein providing the flag comprises:
bonding the flag with the base.

20. The method of claim 18, comprising:
providing a second interconnect coupled between the flag and the base.

* * * * *